(12) United States Patent
Ohtsuka et al.

(10) Patent No.: US 7,323,723 B2
(45) Date of Patent: Jan. 29, 2008

(54) SEMICONDUCTOR LIGHT-EMITTING DEVICE USING PHOSPHORS FOR PERFORMING WAVELENGTH CONVERSION

(75) Inventors: Koji Ohtsuka, Niiza (JP); Hitoshi Murofushi, Niiza (JP)

(73) Assignee: Sanken Electric Co., Ltd. (JP)

( * ) Notice: Subject to any disclaimer, the term of this patent is extended or adjusted under 35 U.S.C. 154(b) by 420 days.

(21) Appl. No.: 10/496,888

(22) PCT Filed: Dec. 27, 2002

(86) PCT No.: PCT/JP02/13835

§ 371 (c)(1),
(2), (4) Date: May 26, 2004

(87) PCT Pub. No.: WO03/058726

PCT Pub. Date: Jul. 17, 2003

(65) Prior Publication Data

US 2006/0175621 A1 Aug. 10, 2006

(30) Foreign Application Priority Data

Dec. 28, 2001 (JP) ............................. 2001-402006

(51) Int. Cl.
*H01L 33/00* (2006.01)

(52) U.S. Cl. ......... 257/98; 257/E33.012; 257/E33.068; 313/507

(58) Field of Classification Search ............ 257/88–98, 257/E33.012, E33.067–E33.07; 313/498–512
See application file for complete search history.

(56) References Cited

U.S. PATENT DOCUMENTS

| | | | |
|---|---|---|---|
| 6,373,188 B1 * | 4/2002 | Johnson et al. | 313/506 |
| 6,404,125 B1 * | 6/2002 | Garbuzov et al. | 313/499 |

FOREIGN PATENT DOCUMENTS

| | | | |
|---|---|---|---|
| JP | 62-58690 | | 3/1987 |
| JP | 05-251738 | | 9/1993 |
| JP | 06-163988 | | 6/1994 |
| JP | 09-153644 | | 6/1997 |
| JP | 09-153645 | | 6/1997 |
| JP | 11-145519 | | 5/1999 |
| JP | 2000-252516 | | 9/2000 |
| JP | 2000-315062 | | 11/2000 |
| JP | 2001291896 A | * | 10/2001 |
| JP | 2001-339060 | | 12/2001 |

* cited by examiner

*Primary Examiner*—Marcos D. Pizarro
(74) *Attorney, Agent, or Firm*—Kilpatrick Stockton LLP

(57) ABSTRACT

A semiconductor light-emitting device includes substrate (3), a plurality of light-emitting-element-layers (10a, 10b, 10c, . . . ) of semiconductor material formed on the substrate (3) so as to be isolated from each other and having a wider band gap than the substrate (3), and phosphors (15a, 15b, 15c, . . . ) converting wavelengths of light from the light-emitting-element-layers (10a, 10b, 10c, . . . ) into other wavelengths.

16 Claims, 20 Drawing Sheets

(a)

(b)

(c)

(a)

(b)

(c)

(a)

(b)

(c)

(d)

(a)

(b)

(c)

(a)

(b)

(c)

(a)

(b)

(c)

(a)

(b)

(c)

(a)

(b)

(c)

(d)

(a)

(b)

(c)

SEMICONDUCTOR LIGHT-EMITTING DEVICE USING PHOSPHORS FOR PERFORMING WAVELENGTH CONVERSION

BACKGROUND OF THE INVENTION

1. Field of the Invention

The present invention relates to a semiconductor light-emitting device and a light-emitting display, and, more particularly, relates to a semiconductor light-emitting device, a light-emitting display, a method for manufacturing a semiconductor light-emitting device and a method for manufacturing a light-emitting display, which convert a wavelength of light from a semiconductor light-emitting-element-layer into other wavelength.

2. Description of the Related Art

Among light-emitting displays such as full-color flat panel displays, those using liquid crystals (LCD) and those using organic electroluminescence (organic EL) are known.

However, in a case where high-definition and high-reliability images or moving images are desired to be obtained, LCD-based displays are disadvantageous in that display speed is low. Meanwhile, organic EL-based displays have problems of long-life reliability and environmental resistance. Furthermore, LCD or organic EL-based displays are disadvantageous in that a large loss of light due to windows and color filters occurs and thus excess energy is required. In addition, there are problems of the complexity of manufacturing processes and the difficulty of cost reduction.

DISCLOSURE OF THE INVENTION

An object of the present invention is to solve the above problems. The present invention provides a semiconductor light-emitting device, a light-emitting display, a method for manufacturing a semiconductor light-emitting device and a method for manufacturing a light-emitting display, in which the display speed is high, long-life reliability, superior environmental resistance, a small loss of light, low energy requirements, simplified manufacturing processes, and cost reduction can be achieved.

In order to achieve the above-described purposes, a first feature of the present invention inheres in a semiconductor light-emitting device, the semiconductor light-emitting device including: (a) a substrate; (b) a plurality of light-emitting-element-layers of semiconductor material formed on the substrate to be isolated from each other and having a wider band gap than the substrate respectively; and (c) a phosphor converting a wavelength of light from the light-emitting-element-layer into other wavelength.

A second feature of the present invention inheres in a light-emitting display implemented by a plurality of pixels on a substrate, each of the pixels including: (a) a plurality of light-emitting-element-layers of semiconductor material formed on the substrate so as to be isolated from each other and having a wider band gap than the substrate respectively; and (b) a phosphor converting a wavelength of light from the light-emitting-element-layer into other wavelength.

A third feature of the present invention inheres in a method for manufacturing a semiconductor light-emitting device, the method including: (a) depositing a light-emitting layer on a substrate having a wider band gap than the substrate; (b) forming a plurality of light-emitting-element-layers by isolating the light-emitting layer; and (c) forming a phosphor on the light-emitting-element-layer to convert a wavelength of light from the light-emitting-element-layer into other wavelength.

A fourth feature of the present invention inheres in a method for manufacturing of a light-emitting display by placing a plurality of pixels on a substrate, each of the pixels being formed by: (a) depositing a light-emitting layer on the substrate having a wider band gap than the substrate; (b) forming a plurality of light-emitting-element-layer by isolating the light-emitting layer; and (c) forming a phosphor on the light-emitting-element-layer to convert a wavelength of light from the light-emitting-element-layer into other wavelength.

BEST MODE FOR CARRYING OUT THE INVENTION

Figure 1:
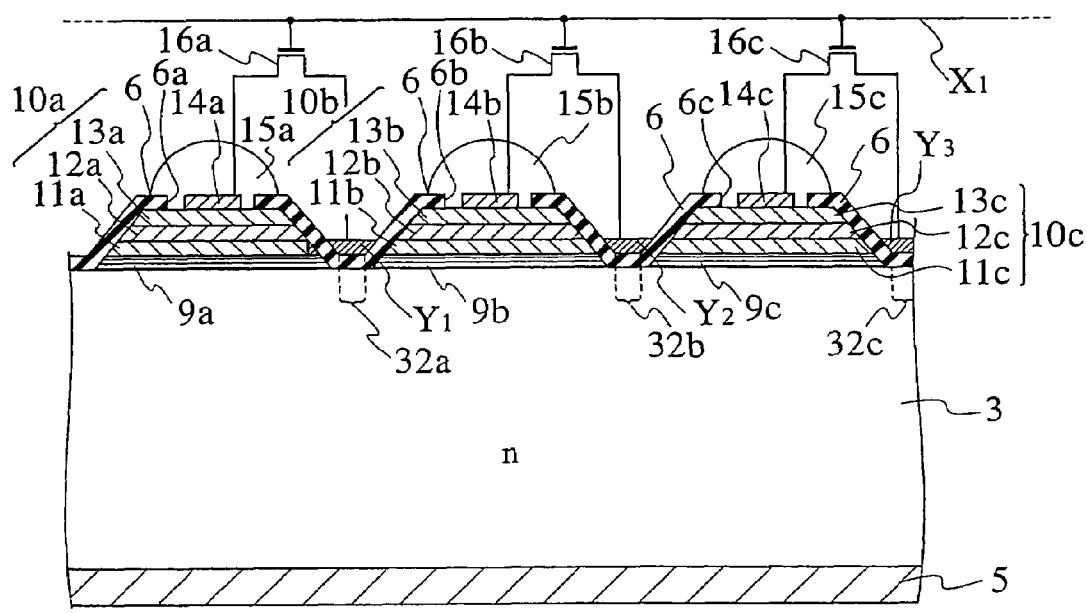
FIG. 1 is a sectional view for explaining a semiconductor light-emitting device and a light-emitting display according to a first embodiment of the present invention (sectional view along I-I shown in FIG. 2).

Various embodiments of the present invention will be described with reference to the accompanying drawings. It is to be noted that the same or similar reference numerals are applied to the same or similar parts and elements throughout the drawings. Generally and as it is conventional in the representation of semiconductor device, it will be appreciated that the various drawings are not drawn to scale from one figure to another nor inside a given figure, and in particular that the layer thicknesses are arbitrarily drawn for facilitating the reading of the drawings.

FIRST EMBODIMENT

As shown in FIG. 1, a light-emitting display according to a first embodiment of the present invention includes a substrate 3, a plurality of (first to third) light-emitting-element-layers 10*a*, 10*b* and 10*c* formed on the substrate 3 so as to be isolated from each other, and first to third phosphors 15*a*, 15*b* and 15*c* which are placed on the first to third light-emitting-element-layers 10*a*, 10*b* and 10*c* and convert wavelengths of light from the first to third light-emitting-element-layers 10*a*, 10*b* and 10*c* into different wavelengths.

FIG. 1 shows a semiconductor light-emitting device including the first to third light-emitting-element-layers 10*a*, 10*b* and 10*c* and the first to third phosphors 15*a*, 15*b* and 15*c* which constitute one unit picture element (pixel). However, in the light-emitting display according to the first embodiment of the present invention, a plurality of unit picture elements (pixels) constituting an m×n matrix which constitutes the light-emitting display body, are actually arranged. Accordingly, in practice, in addition to those shown in FIG. 1, there are first light-emitting-element-layers 10*a*, 10*e*, . . . , first phosphors 15*a*, 15*e*, . . . , second light-emitting-element-layers 10*b*, 10*f*, . . . , second phosphors 15*b*, 15*f*, . . . , third light-emitting-element-layers 10*c*, 10*d*, . . . , and third phosphors 15*c*, 15*d*, . . . Luminous element layers and the like constituting other pixels which are not shown in FIGS. 1 to 20 are represented by symbols " . . . " in the first to sixth embodiments and the like of the present invention described below.

Furthermore, in the light-emitting display according to the first embodiment of the present invention, distributed Bragg reflectors (DBRs) 9*a*, 9*b*, 9*c*, . . . are placed between the substrate 3 and the first to third light-emitting-element-layers 10*a*, 10*b*, 10*c*, . . . , respectively. Moreover, the light-emitting display further has a cathode electrode 5 placed on the back surface (second main surface) of the substrate 3; a silicon oxide film 6 placed to cover exposed portions of the substrate 3, exposed portions of the DBRs 9*a*, 9*b*, 9*c*, . . . , and exposed portions of the first to third light-emitting-element-layers 10*a*, 10*b*, 10*c*, . . . ; and anode electrodes 14*a*, 14*b*, 14*c*, . . . placed within windows 6*a*, 6*b*, 6*c*, . . . of the silicon oxide film 6 on the first to third light-emitting-element-layers 10*a*, 10*b*, 10*c*, . . . .

Figure 2:
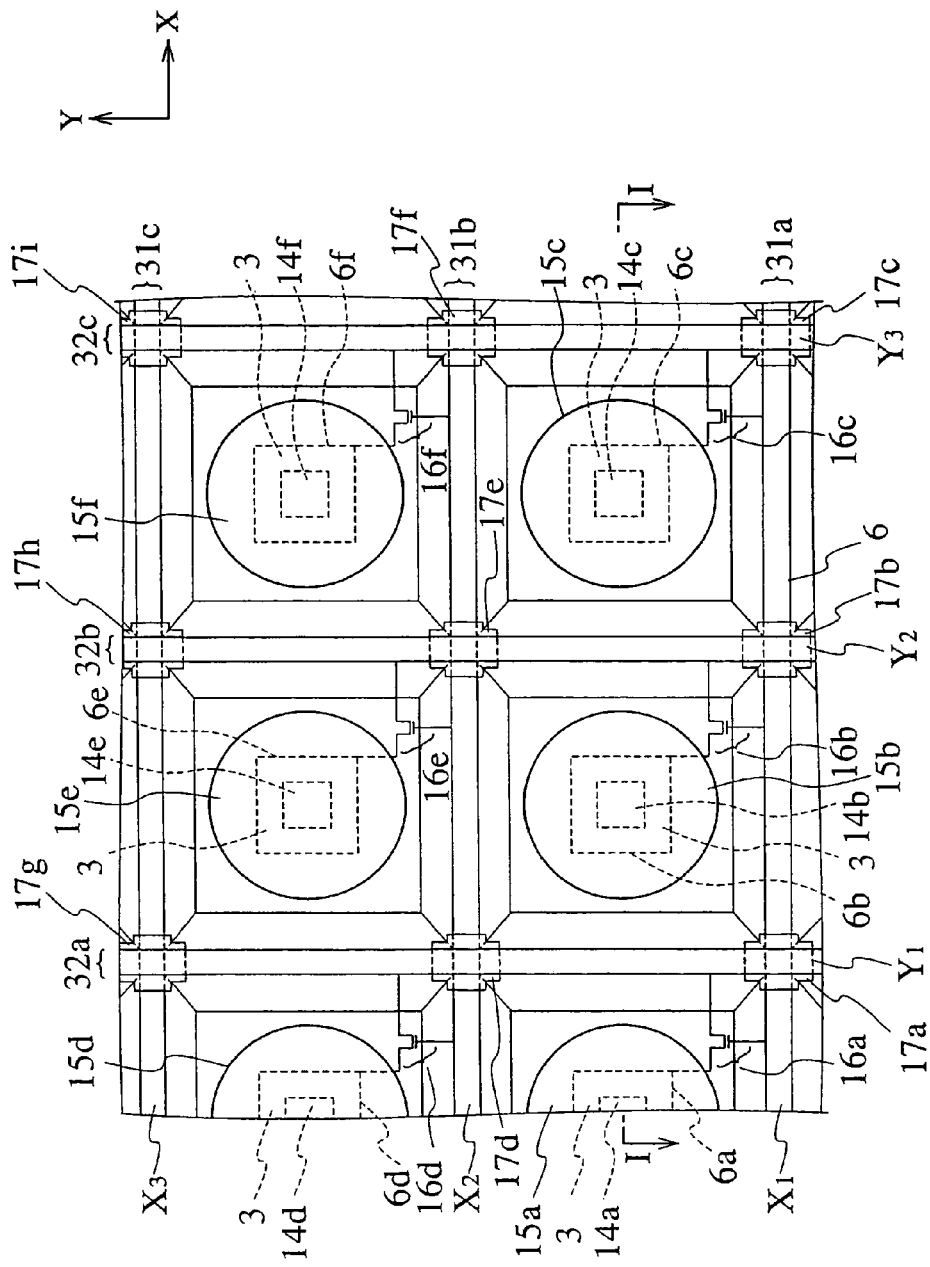
FIG. 2 is a plan view for explaining the semiconductor light-emitting device and the light-emitting display according to the first embodiment of the present invention.
Figure 3:
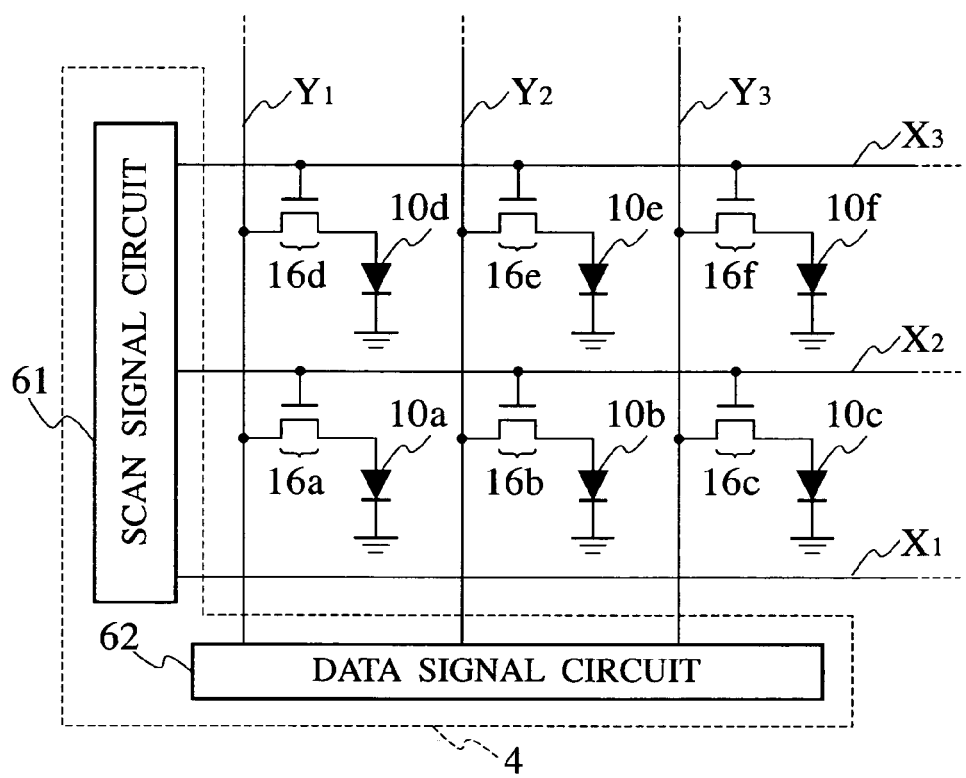
FIG. 3 is a partial equivalent circuit of the light-emitting display according to the first embodiment of the present invention.

As shown in FIG. 2, the first to third light-emitting-element-layers 10*a*, 10*b*, 10*c*, . . . and the DBRs 9*a*, 9*b*, 9*c*, . . . shown in FIG. 1 are delimited in a mesh pattern by a plurality of grooves 31*a*, 31*b*, 31*c*, . . . running parallel to each other in the X-axis direction and a plurality of grooves 32*a*, 32*b*, 32*c*, . . . running parallel to each other in the Y-axis direction orthogonal to the plurality of grooves 31*a*, 31*b*, 31*c*, . . . . Moreover, the first to third phosphors 15*a* to 15*f*, . . . are regularly placed to cover the respective windows 6*a* to 6*f*, . . . to guide light out, thus constituting a dot-matrix full-color light-emitting display. Accordingly, a matrix is constituted by a plurality of gate electrode lines $X_1$, $X_2$, $X_3$, . . . running in the horizontal direction and a plurality of source electrode lines $Y_1$, $Y_2$, $Y_3$, . . . running parallel to each other in the vertical direction to be orthogonal to the gate electrode lines $X_1$, $X_2$, $X_3$, . . . . As shown in FIGS. 2 and 3, the plurality of gate electrode lines $X_1$, $X_2$, $X_3$, . . . are placed in the grooves 31*a*, 31*b*, 31*c*, . . . on the silicon oxide film 6, respectively, and are wired to have a thickness of approximately 100 nm. The plurality of source electrode lines $Y_1$, $Y_2$, $Y_3$, . . . are respectively placed in portions corresponding to the grooves 32*a*, 32*b*, 32*c*, . . . on the silicon oxide film 6 and interlayer insulating films 17*a* to 17*i*, . . . .

The picture elements are placed at the intersections of this matrix, respectively. Further, the drain electrodes of thin film transistors (TFTs) 16*a* to 16*f*, . . . are connected to the light-emitting-element-layers 10*a* to 10*f*, . . . of each picture element through the anode electrodes 14*a* to 14*f*, . . . (FIG. 2). As for the structure of TFTs 16*a* to 16*f*, . . . , there are, for example, two types of TFTs: a planar type and a staggered type for polysilicon (p-Si) TFTs; other types of TFTs include a normal staggered type, an inverted staggered structure and the like for amorphous silicon (a-Si) TFTs. A TFT structure appropriate for the embodiment is employed for the TFTs 16*a* to 16*f*, . . . . The placement positions of the TFTs 16*a* to 16*f*, . . . are not particularly limited but appropriately selected. For example, the TFTs 16*a* to 16*f*, . . . are placed in the vicinities of intersections of the gate electrode lines $X_1$, $X_2$, $X_3$, . . . and the source electrode lines $Y_1$, $Y_2$, $Y_3$, . . . on the silicon oxide film 6. Moreover, as shown in FIG. 3, the gate electrodes of the TFTs 16*a* to 16*f*, . . . are electrically connected to the gate electrode lines $X_1$, $X_2$, $X_3$, . . . , respectively.

Further, the source electrodes of the TFTs 16*a* to 16*f*, . . . are electrically connected to the source electrode lines $Y_1$, $Y_2$, $Y_3$, . . . , respectively. As shown in FIG. 3, the plurality of gate electrode lines $X_1$, $X_2$, $X_3$, . . . are connected to a scan signal circuit 61, and the plurality of source electrode lines $Y_1$, $Y_2$, $Y_3$, . . . are connected to a data signal circuit 62. The scan signal circuit 61 and the data signal circuit 62 constitute a driving circuit 4. Note that the placement positions of the gate electrode lines $X_1$, $X_2$, $X_3$, . . . and the source electrode lines $Y_1$, $Y_2$, $Y_3$, . . . shown in FIG. 2 are examples and appropriately selected in accordance with the structure and shape of the light-emitting display.

As for the substrate 3, a low-resistance substrate made of $n^+$ type silicon single crystal having a (100) plane can be used. For example, an FZ substrate, a CZ substrate, an MCZ substrate, or the like into which n-type impurities, such as antimony (Sb) or phosphorus (P), are introduced at an impurity density of approximately $5 \times 10^{18}$ to $5 \times 10^{19}$ cm$^{-3}$ should be used. The substrate 3, in conjunction with the cathode electrode 5, serves as a common cathode area and a support medium for the plurality of light-emitting-element-layers 10*a* to 10*f*, . . . . The resistivity at the above-described impurity density is approximately 0.0015 Ωcm to 0.01 Ωcm. In the first embodiment of the present invention, the thickness of the substrate 3 is set to be approximately 350 μm so as to favorably serve as a support medium for the light-emitting-element-layers 10a, 10b, 10c, . . . and the like.

Figure 4:
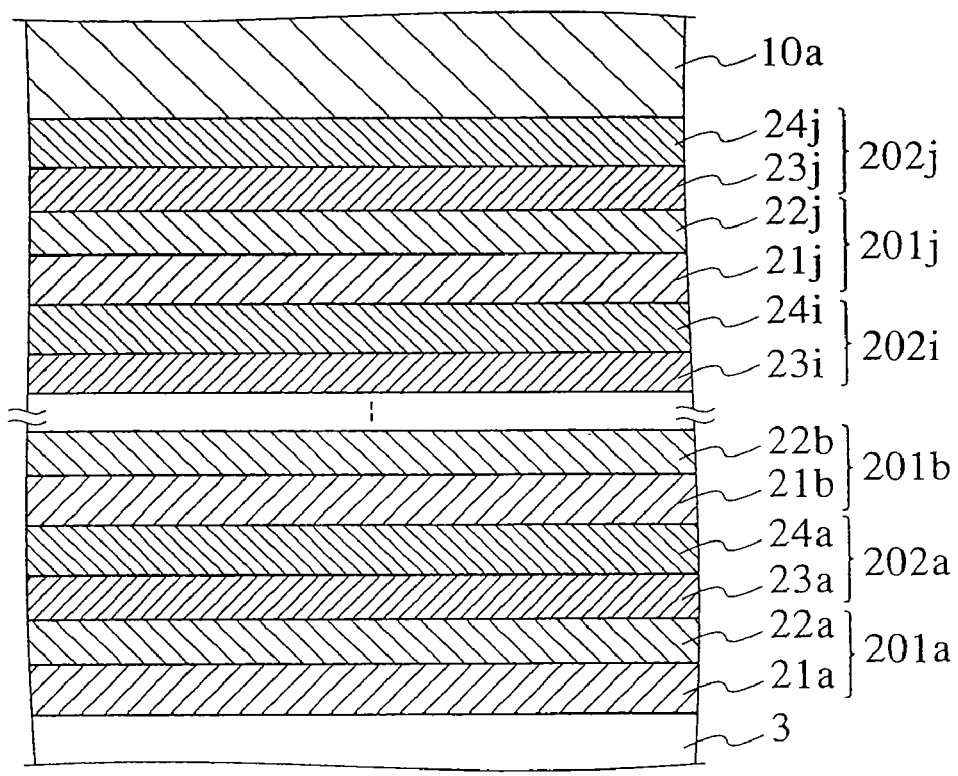
FIG. 4 is a sectional view of a DBR according to the first embodiment of the present invention.

As shown in FIG. 4, in each of the DBRs 9a, 9b, 9c, . . . , ten layers of low-refractive-index layers 201a to 201j and ten layers of high-refractive-index layers 202a to 202j, for a total of twenty layers, are alternately superimposed. Further, the low-refractive-index layer 201a is configured by a well layer 21a and a barrier layer 22a. The low-refractive-index layer 201b is configured by a well layer 21b and a barrier layer 22b, . . . , and the low-refractive-index layer 201j is configured by a well layer 21j and a barrier layer 22j. Moreover, the high-refractive-index layer 202a is configured by a well layer 23a and a barrier layer 24a. The high-refractive-index layer 202b is configured by a well layer 23b and a barrier layer 24b, . . . , and the high-refractive-index layer 202j is configured by a well layer 23j and a barrier layer 24j. That is, the well layer 21a, the barrier layer 22a, the well layer 23a, and the barrier layer 24a are sequentially superimposed. Similarly, the barrier layer 21b, the well layer 22b, . . . , the barrier layer 23j, and the well layer 24j are sequentially superimposed.

The well layers 21a to 21j of the low-refractive-index layers are made of $Al_zGa_{1-z}N$ (composition value satisfies $0 \leq z \leq 0.5$) or the like. For example, where z=0, a very thin n-type semiconductor layer made of GaN is obtained. Further, the barrier layers 22a to 22j of the low-refractive-index layers are made of $Al_wGa_{1-w}N$ (composition values satisfy $w \geq z$) or the like. For example, where w=0, a very thin insulating film made of aluminum nitride (AlN) is obtained. Moreover, the well layers 23a to 23j of the high-refractive-index layers are made of $Al_xGa_yIn_{1-x-y}N$ (composition values satisfy $0 \leq x \leq 0.5$, $0 \leq y \leq 1$, $0 \leq x+y \leq 1$) or the like. For example, where x=y=0, a very thin n-type semiconductor layer made of indium nitride (InN) is obtained. Furthermore, the barrier layers 24a to 24j of the high-refractive-index layers are made of $Al_1Ga_{1-t}N$ (composition value satisfies $0 \leq t \leq 1$) or the like. For example, where t=0, a very thin insulating film made of GaN is obtained. Here, the well layers 21a to 21j of the low-refractive-index layers, the barrier layers 22a to 22j of the low-refractive-index layers, and the well layers 23a to 23j of the high-refractive-index layers are lower in indium (In) content than the barrier layers 24a to 24j of the high-refractive-index layers, or do not contain In. The thicknesses of the DBRs 9a, 9b, 9c, . . . are arbitrarily determined by the wavelengths of light emitted from the light-emitting-element-layers 10a, 10b, 10c. In the first embodiment of the present invention, the light-emitting-element-layers 10a, 10b, 10c, . . . emit light with a wavelength of 380 nm. The thickness of each layer of the DRBs 9a, 9b, 9c, . . . can be determined by $\lambda/4 \times 1/n$ ($\lambda$ is an emission wavelength and n is a refractive index), and is set as a value at which the DBRs have the maximum reflectivity for the wavelengths of light. It is preferred that the thicknesses of the well layers 21a to 21j and the well layers 23a to 23j are approximately 0.5 to 20 nm so that quantum well levels are formed. It is preferred that the thicknesses of the barrier layers 22a to 22j and the barrier layers 24a to 24j are approximately 0.5 to 10 nm so that quantum mechanical tunnel effect occurs. Note that the DBRs 9a, 9b, 9c, . . . have been disclosed in Japanese Unexamined Patent Publication No. 2001-291896, proposed by the applicant.

The first to third light-emitting-element-layers 10a, 10b, 10c, . . . are made of semiconductor material having a band gap wider than the substrate of a wide band gap semiconductor or the like. That is, the substrate 3 is opaque to light emitted from the first to third light-emitting-element-layers 10a, 10b, 10c, . . . . Here, "wide gap semiconductor (wide band gap semiconductor)" is a term contrasted with semiconductor materials having normal band gaps, such as silicon (with a band gap of approximately 1.1 eV) and gallium arsenide (with a band gap of approximately 1.4 eV), which have been studied since an early stage in the semiconductor industry and practical use of which has advanced. "Handoutai Yougo Daijiten (Comprehensive Dictionary of Semiconductor Terms)" (The Nikkan Kogyo Shimbun, Ltd.) defines wide gap semiconductor as "semiconductor material having a band gap of 2.6 eV or higher." Some literature defines wide gap semiconductor as semiconductor material having a band gap of 2.45 eV or higher. The definition of the wide gap semiconductor is thus not necessarily clear. To those skilled in the art, it is a known fact that, in contrast to "wide gap semiconductor," semiconductor materials including indium antimonide and mercury cadmium tellurium, which have band gaps of 0.2 eV or lower, are referred to as narrow band gap semiconductor (narrow gap semiconductor). Accordingly, it should be noted that "wide gap" and "narrow gap" are not terms which mean relative widths requiring "standards of comparison" but terms which mean band gaps apparent to those skilled in the art. In the present invention, semiconductor material having a band gap of 2.45 eV or higher is defined as "wide gap semiconductor."

The first light-emitting-element-layer 10a is, for example, a light-emitting diode (LED) having a DH structure and including an n-type semiconductor area (n-type cladding layer) 11a made of gallium nitride (GaN) or the like, an active layer 12a placed on the n-type cladding layer 11a and made of indium gallium nitride (InGaN) or the like, and is not intentionally doped with impurities, and a p-type semiconductor area (p-type cladding layer) 13a placed on the active layer 12a and made of GaN or the like. Ideally, a semiconductor area corresponding to the "semiconductor area which is not intentionally doped with impurities" is a semiconductor area which can be substantially regarded as an i-type semiconductor area (intrinsic semiconductor area), or an n$^-$ type (v type) or p$^-$ type ($\pi$ type) semiconductor area having a low impurity density. However, actually, the words "not intentionally doped with impurities" allow a very small amount of unintended residual of p-type or n-type dopants. Considering the level of the current crystal growth technology of compound semiconductors, even a semiconductor area having an impurity density of approximately $5 \times 10^{-14}$ cm$^{-3}$ to $1 \times 10^{16}$ cm$^{-3}$ can be referred to as "semiconductor area which is not intentionally doped with impurities." Hereinafter, the words "not intentionally doped with impurities" are referred to as "non-doped." Moreover, the structure of the second light-emitting-element-layer 10b is substantially the same as that of the first light-emitting-element-layer 10a. The second light-emitting-element-layer 10b is an LED having a DH structure and including an n-type GaN cladding layer 11b, a non-doped InGaN active layer 12b, and a p-type GaN cladding layer 13b. Further, the structure of the third light-emitting-element-layer 10c is substantially the same as that of the first and second light-emitting-element-layers 10a and 10b. The third light-emitting-element-layer 10c is an LED having a DH structure and including an n-type GaN cladding layer 11c, a non-doped InGaN active layer 12c, and a p-type GaN cladding layer 13c. Thus, specifically speaking, the first to third phosphors 15a, 15b and 15c are placed on the p-type cladding layers 13a, 13b and 13c respectively.

Various structures may be used for the first to third light-emitting-element-layers 10a, 10b, 10c, . . . . The structures include a single hetero (SH) structure and a double hetero (DH) structure. Apart from GaN, also used in these structures is a pn junction of a wide band gap semiconductor such as aluminum phosphide (AlP) having a band gap of approximately 5.9 eV, zinc selenide (ZnSe) having a band gap of approximately 2.6 eV, zinc sulfide (ZnS) having a band gap of approximately 3.6 eV, and magnesium sulfide (MgS) having a band gap of approximately 4.5 eV, or a ternary or quaternary compound thereof. As for the substrate 3 for the light-emitting-element-layers, various low-resistance substrates can be used, which include, for example, a silicon single crystal substrate, a sapphire ($Al_2O_3$) substrate, and a gallium arsenide (GaAs) substrate. Excitation light emitted from the first to third light-emitting-element-layers 10a, 10b, 10c, . . . may be light having the same wavelength, or may be light having wavelengths different from each other.

Each of the anode electrodes 14a, 14b, 14c, . . . can be, for example, a thin metal oxide film, such as a tin oxide ($SnO_2$) film or an indium tin oxide (ITO) film, which is optically transparent. Alternatively, a thin metal film such as a nickel-gold (AuNi) alloy film with a sufficiently small thickness and optically transparent can also be used. Output light, such as ultraviolet light, which has been emitted from the light-emitting-element-layers 10a to 10f, . . . , is guided externally through the windows 6a to 6f, . . . of the silicon oxide film 6 shown in FIGS. 1 and 2. Note that emitted light is also guided out through transparent anode electrodes 14a to 14f, . . . .

The first phosphors 15a, 15e, . . . convert the wavelength of light from the first light-emitting-element-layers 10a, 10e, . . . into a first wavelength of, for example, red light. Further, the second phosphors 15b, 15f, . . . convert the wavelength of light from the second light-emitting-element-layers 10b, 10f, . . . into a second wavelength of, for example, blue light which is different from the first wavelength. Moreover, the third phosphors 15c, 15d, . . . convert the wavelength of light from the third light-emitting-element-layers 10c, 10d, . . . into a third wavelength of, for example, green light which is different from both the first and second wavelengths. The phosphors 15a, 15b, 15c, . . . can be, for example, phosphors including a yttrium-aluminum-garnet (YAG) phosphor and an organic phosphor. To be more specific, where ultraviolet light is emitted from the light-emitting-element-layers 10a, 10b, 10c, . . . , it is preferred that, for example, the first phosphors 15a, 15d, . . . are phosphors of $Y_2O_2S$:Eu or the like which convert into red as light having the first wavelength, the second phosphors 15b, 15e, . . . are phosphors of $BaMg_2Al_{16}O_{27}$:Eu or the like which convert into blue as light having the second wavelength, and the third phosphors 15c, 15f, . . . are phosphors of $BaMg_2Al_{16}O_{27}$:Eu, Mn or the like which perform wavelength conversion into green as light having the third wavelength. On the other hand, where the first to third light-emitting-element-layers 10a, 10b, 10c, . . . are blue LEDs, the first phosphors 15a, 15d, . . . are, for example, first phosphors of CaS:Eu or the like which perform wavelength conversion into red as light having the first wavelength. Further, the third phosphors 15c, 15f, . . . are preferably ZnS:Ca or the like which perform wavelength conversion into green as the third wavelength light. Note that, since light emitted from the light-emitting-element-layers 10a, 10b, 10c, . . . is blue, the second phosphors 15b, 15e, . . . which perform wavelength conversion into blue as light of the second wavelength, are not necessary.

A driving method of the light-emitting display according to the first embodiment of the present invention is a random access drive similar to an active matrix drive. For example, in FIG. 3, in accordance a moment at which the gate electrode line $X_2$ is scanned by the scan signal circuit 61 and a positive pulse signal is applied thereto, predetermined signal voltages are applied from the data signal circuit 62 to the source electrode lines $Y_1$, $Y_2$, $Y_3$, . . . , respectively. At this time, if a voltage at a level at which the light-emitting-element-layers 10a to 10f, . . . emit light is applied to the source electrode line $Y_2$ and voltages at levels at which the light-emitting-element-layers 10a to 10f, . . . do not emit light are applied to the other source electrode lines $Y_1$ and $Y_3$, light is emitted only from the light-emitting-element-layer 10b.

As described earlier, with the light-emitting display according to the first embodiment of the present invention, display speed can be enhanced, longevity can be increased, and environmental resistance and reliability can also be improved by converting the wavelengths of light from the first to third light-emitting-element-layers 10a, 10b, 10c, . . . into first, second, and third wavelengths different from the foregoing wavelengths through the first to third phosphors 15a, 15b, 15c, . . . .

Further, provision of the first to third phosphors 15a, 15b, 15c, . . . eliminates the necessity of color filters and achieves an extremely small loss of light. In addition, manufacturing processes can be simplified, achieving cost reduction.

Since the substrate 3 is opaque to light from the first to third light-emitting-element-layers 10a, 10b, 10c, . . . , the substrate 3 can favorably absorb the light (ultraviolet to blue light) having relatively short wavelengths which have been emitted from the first to third light-emitting-element-layers 10a, 10b, 10c, . . . toward the substrate 3. Accordingly, it is possible to prevent the occurrence of the spreading of light and the color mixture of the light emitted from the neighboring light-emitting-element-layers 10a, 10b, 10c, . . . . Further, a semiconductor device, such as a driver IC, can be easily integrated in the substrate 3 by adopting a silicon single crystal substrate as the substrate 3. Moreover, a full-color light-emitting display can be easily obtained by adopting, as the first to third light-emitting-element-layers 10a, 10b, 10c, . . . , a nitride-based compound semiconductor which emits light having a relatively short wavelength favorably absorbed by the substrate 3. Furthermore, the dispersion characteristics of a nitride-based compound semiconductor is small. Thus, reliability is also improved.

Moreover, the DBRs 9a, 9b, 9c, . . . contain In, and thus favorably serve as buffer layers and can favorably inherit the crystal orientation of the substrate 3. Further, the occurrence of strains due to a difference in thermal expansion coefficients between the substrate and the light-emitting-element-layers can be favorably prevented. Thus, the light-emitting-element-layers 10a, 10b, 10c, made of a GaN-based compound semiconductor which has favorable crystallinity can be placed on the DBRs 9a, 9b, 9c, . . . . In addition, the substrate 3 is opaque to ultraviolet light having a wavelength of approximately 380 nm, emitted from the light-emitting-element-layers 10a, 10b, 10c, . . . , and absorbs part of the light emitted. Accordingly, light-emitting efficiency is deteriorated, and brightness is decreased.

In the first embodiment of the present invention, since the DBRs 9a, 9b, 9c, . . . are provided, the DBRs 9a, 9b, 9c, . . . serve as reflective films and prevent the substrate 3 from absorbing light. Accordingly, the light-emitting efficiency of a light-emitting device can be increased. Furthermore, since the DBRs 9a, 9b, 9c, . . . are delimited not by the substrate 3 but by the grooves in the substrate 3, the color mixing of the neighboring light-emitting-element-layers 10a, 10b, 10c, . . . can be prevented.

The phosphors 15a, 15b, 15c, . . . are appropriately used depending on the wavelengths of light emitted from the first to third light-emitting-element-layers 10a, 10b, 10c, . . . . Thus, the wavelengths of light are not particularly limited. In other words, the light-emitting-element-layers 10a, 10b, 10c, . . . which emit light having wavelengths capable of being converted into first, second, and third wavelengths suitable for light-emitting display, by the phosphors 15a, 15b, 15c, . . . , generally emit excitation light having wavelengths of blue light to ultraviolet light. Therefore, the light-emitting-element-layers 10a, 10b, 10c, . . . can effectively excite the first to third phosphors 15a, 15b, 15c, . . . . However, as a matter of course, the compositions and structures of the first to third light-emitting-element-layers 10a, 10b, 10c, . . . are not particularly limited. In later-described second to sixth embodiments of the present invention, the compositions and structures thereof do not have to be particularly limited either, as described above.

Figure 5:
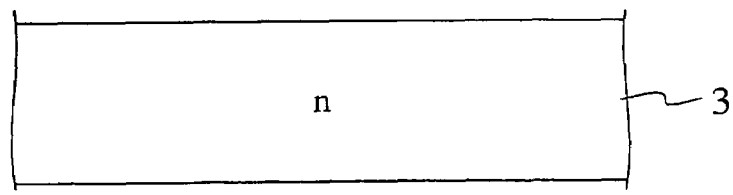
FIGS. 5 and 6 are sectional views for explaining a method for manufacturing the semiconductor light-emitting device and the light-emitting display according to the first embodiment of the present invention.
Figure 5:
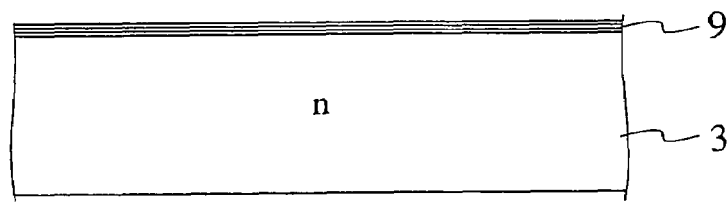
Figure 5:
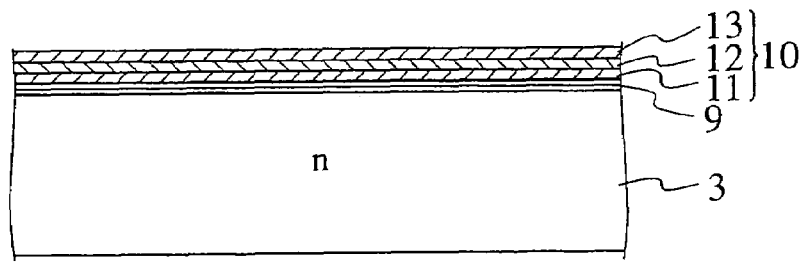
Figure 6:
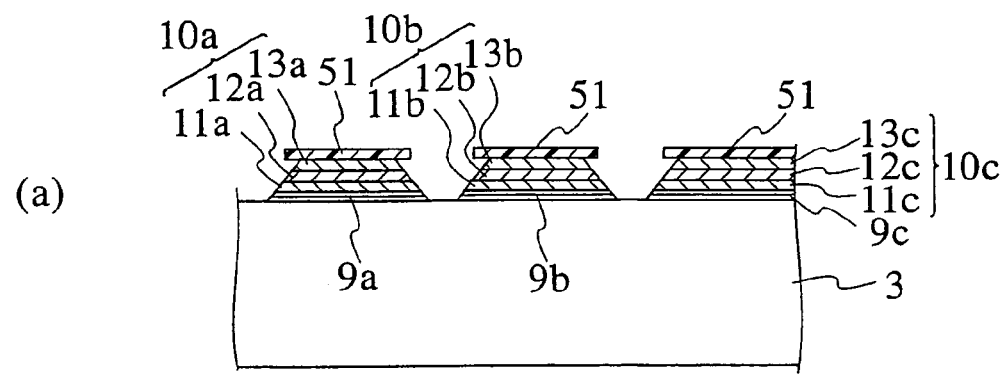
Figure 6:
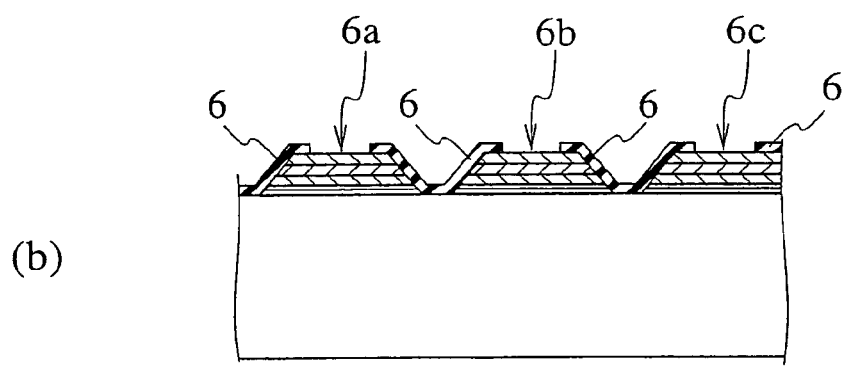
Figure 6:
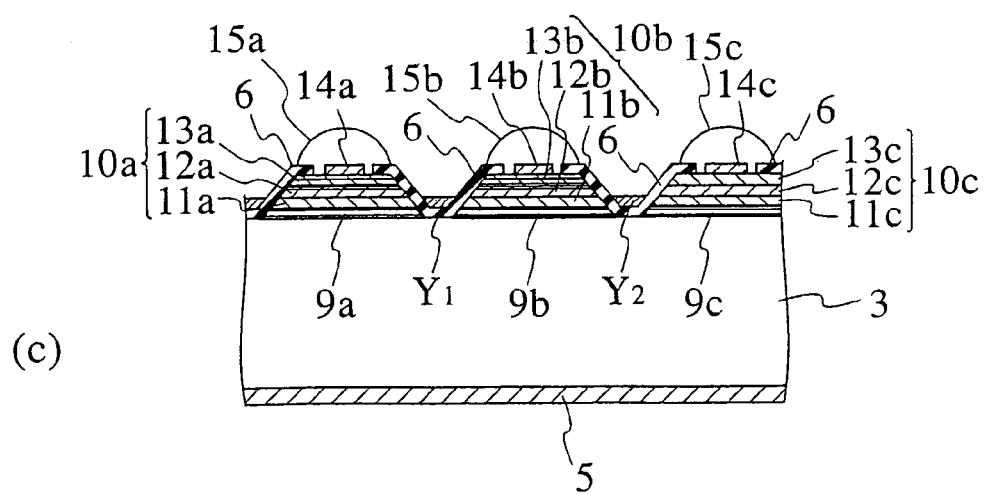

Next, with reference to FIGS. 5 and 6, a method of manufacturing the light-emitting display according to the first embodiment of the present invention will be described.

(a) First, as shown in FIG. 5(a), the substrate 3 made of an n-type silicon single crystal in which the main surface thereof is the (100) plane, is prepared. Next, as shown in FIG. 5(b) (see FIG. 4 for more details), using epitaxial growth such as metal-organic chemical vapor deposition (MOCVD), the barrier layer 21a of a low-refractive-index layer, the well layer 22a of the low-refractive-index layer, the barrier layer 23a of a high-refractive-index layer, the well layer 24a of the 15 high-refractive-index layer, the barrier layer 21b of a low-refractive-index layer, the well layer 22b of the low-refractive-index layer, . . . , the barrier layer 23i of a high-refractive-index layer, the well layer 24i of the high-refractive-index layer, the barrier layer 21j of a low-refractive-index layer, the well layer 22j of the low-refractive-index layer, the barrier layer 23j of a high-refractive-index layer, and the well layer 24j of the high-refractive-index layer are superimposed on the substrate 3 in the above-stated order to form a DBR 9. This DBR 9 has a structure in which layers are superimposed for 10 cycles, where one cycle is a barrier layer of a low-refractive-index layer/a well layer of the low-refractive-index layer/a barrier layer of a high-refractive-index layer/a well layer of the high-refractive-index layer. Subsequently, as shown in FIG. 5(c), an n-type cladding layer 11, a non-doped active layer 12, and a p-type cladding layer 13 are sequentially and continuously deposited on the DBR 9 by epitaxial growth, thus forming a light-emitting layer 10.

(b) Next, resist is applied to the p-type cladding layer 13 by spin coating, and this resist is patterned using photolithography technology. Thereafter, as shown in FIG. 6(a), by using the patterned resist 51 as an etching mask, the light-emitting layer 10 and the DBR 9 are etched until the substrate 3 is exposed, by wet etching or the like. In wet etching, for example, a hydrochloric acid/nitric acid (HCl/HNO$_3$) solution, a sodium hydroxide (NaOH) solution, a potassium hydroxide (KOH) solution, or the like is used as an etching solution. As a result, the DBR 9 is divided into a plurality of DBRs 9a, 9b, 9c, . . . , and the light-emitting layer 10 is divided into a first light-emitting-element-layer 10a on the DBR 9a, a second light-emitting-element-layer 10b on the DBR 9b, and a third light-emitting-element-layer 10c on the DBR 9c, . . . . As shown in FIG. 6(a), the first light-emitting-element-layer 10a is configured by the n-type cladding layer 11a, the non-doped active layer 12a, and the p-type cladding layer 13a. Further, the second light-emitting-element-layer 10b is configured by the n-type cladding layer 11b, the non-doped active layer 12b, and the p-type cladding layer 13b, and the third light-emitting-element-layer 10c is configured by the n-type cladding layer 11c, the non-doped active layer 12c, and the p-type cladding layer 13c. Instead of wet etching, it is possible to use methods including reactive ion etching (RIE) in which chlorine (Cl$_2$) gas or the like is used. Thereafter, the resist 51 is removed using resist remover or the like.

(c) Subsequently, the silicon oxide film 6 is superimposed by CVD or the like to cover the substrate 3, the DBRs 9a, 9b, 9c, . . . , and the light-emitting-element-layers 10a, 10b, 10c, . . . . An etching mask of resist is delineated by lithography technology. By an etching technique such as RIE, in which this etching mask is used, the windows 6a, 6b, 6c, . . . for exposing the respective p-type cladding layers 13a, 13b, 13c, . . . are opened in the silicon oxide film 6 as shown in FIG. 6(b).

(d) After the resist used for opening the windows 6a, 6b, 6c, . . . is removed, new resist is applied onto the silicon oxide film 6 and the windows 6a, 6b, 6c, . . . and patterned by lithography technology in order to use the lift-off method. Then, a metal film of Au—Ni alloy or the like is thinly deposited to be optically transparent by vacuum deposition, sputtering, or the like. Subsequently, the resist is lifted off, whereby the anode electrodes 14a, 14b, 14c, . . . which are in low-resistance ohmic contact with the p-type cladding layers 13a, 13b, 13c, . . . are formed on the light-emitting-element-layers 10a, 10b, 10c, . . . , more specifically, on the p-type cladding layers 13a, 13b, 13c, . . . , as shown in FIG. 6(c).

(e) Next, a thin film of refractory metal, such as tungsten (W), titanium (Ti), or molybdenum (Mo), is deposited on the entire surface of the wafer by sputtering or the like. Then, an etching mask of resist is delineated by lithography technology. By RIE or the like in which this etching mask is used, the gate electrode lines $X_1, X_2, X_3, \ldots$ (FIG. 2) made of refractory metal are patterned on the grooves 31a, 31b, 31c . . . (FIG. 2). At this time, the gate electrode lines $X_1, X_2, X_3, \ldots$ are formed to be extended to respective bonding pads for electrically connecting to the external scan signal circuit 61 (FIG. 2). Next, a first interlayer insulating film (not shown) is deposited on the gate electrode lines $X_1, X_2, X_3, \ldots$ by CVD. Further, another thin refractory metal film is deposited on the entire upper surface of the first interlayer insulating film by sputtering or the like. An etching mask of resist is then delineated by lithography technology. By RIE or the like in which this etching mask is used, the source electrode lines $Y_1, Y_2, Y_3, \ldots$ are formed along the grooves 32a, 32b, 32c, . . . . At this time, the source electrode lines $Y_1, Y_2, Y_3, \ldots$ are formed to be extended to respective bonding pads for electrically connecting to the data signal circuit 62.

(f) Next, a second interlayer insulating film (not shown) is deposited on the source electrode lines $Y_1, Y_2, Y_3, \ldots$ by CVD. Thereafter, an etching mask of resist is delineated by lithography technology. By RIE or the like in which this etching mask is used, anode contact holes for partially exposing the anode electrodes 14a, 14b, 14c, . . . and source contact holes for partially exposing the source electrode lines $Y_1, Y_2, Y_3, \ldots$ are opened in part of the second interlayer insulating film. Then, a polysilicon layer or amorphous silicon layer is formed on the top of the second interlayer insulating film through the anode and source contact holes by using monosilane ($SiH_4$), disilane ($Si_2H_6$), or the like; At this time, diborane ($B_2H_6$) is added as p-type dopant gas to $SiH_4$ or $Si_2H_6$ to form a p-type polysilicon layer or a p-type amorphous silicon layer. Then, an etching mask of resist is delineated by lithography technology. By RIE or the like in which this etching mask is used, the p-type polysilicon layer or the p-type amorphous silicon layer is patterned into islands to form individually isolated device areas for TFTs. The device areas for TFTs are connected to the corresponding anode electrodes $14a$, $14b$, $14c$, . . . and the corresponding source electrode lines $Y_1$, $Y_2$, $Y_3$, . . . through the anode and source contact holes, respectively.

(g) A gate insulating film is deposited on the p-type polysilicon layer or the p-type amorphous silicon layer by CVD. Then, an etching mask of resist is delineated by lithography technology. By RIE or the like in which this etching mask is used, gate contact holes for partially exposing the gate electrode lines $X_1$, $X_2$, $X_3$, . . . are opened in part of the gate insulating film. A polysilicon layer is formed on this gate insulating film using $SiH_4$ or $Si_2H_6$ again. Then, an etching mask of resist is delineated by lithography technology. By RIE or the like in which this etching mask is used, the gate electrodes of the TFTs are patterned. Alternatively, the gate electrodes of the TFTs may be formed as follows: refractory metal, refractory metal silicide ($WSi_2$, $TiSi_2$, $MoSi_2$), or the like, or polycide using such refractory metal silicide is deposited by CVD, sputtering, or vacuum deposition, and selectively etched by RIE or the like. The gate electrodes of the TFTs are connected to the gate electrode lines $X_1$, $X_2$, $X_3$, . . . through the gate contact holes.

(h) Using the patterned gate electrodes as a mask, n-type impurities, such as arsenic ($As^+$), are implanted to form source/drain areas of the TFTs. Furthermore, a third interlayer insulating film (not shown) is deposited on the gate electrodes of the TFTs by CVD. Thereafter, Al, Al—Ni alloy, or the like is deposited on the back surface (second main surface) of the substrate 3 by vacuum deposition, sputtering, or the like to form the cathode electrode 5. Next, in order to use the lift-off method, new resist is applied to the third interlayer insulating film and patterned by lithography technology. Then, fluorescent material is deposited by vacuum deposition, sputtering, or the like. Subsequently, the resist is lifted off, thereby forming the first phosphors $15a$, $15e$, . . . on the first light-emitting-element-layers $10a$, $10e$, . . . , the second phosphors $15b$, $15f$, . . . on the second light-emitting-element-layers $10b$, $10f$, . . . , and the third phosphors $15c$ and $15g$ on the third light-emitting-element-layers $10c$ and $10g$ as shown in FIG. 6($c$).

(i) In the case where the driving circuit 4 is provided externally, the gate electrode lines $X_1$, $X_2$, $X_3$, . . . and the source electrode lines $Y_1$, $Y_2$, $Y_3$, . . . are connected to the external driving circuit 4 by bonding or the like after the substrate 3 is mounted in a package. Thereafter, for example, the light-emitting display and the driving circuit 4 are mounted in the package to be integrated.

The method of manufacturing the light-emitting display according to the first embodiment of the present invention is an example. As a matter of course, the light-emitting display body can be achieved by various manufacturing methods other than this.

SECOND EMBODIMENT

Figure 7:
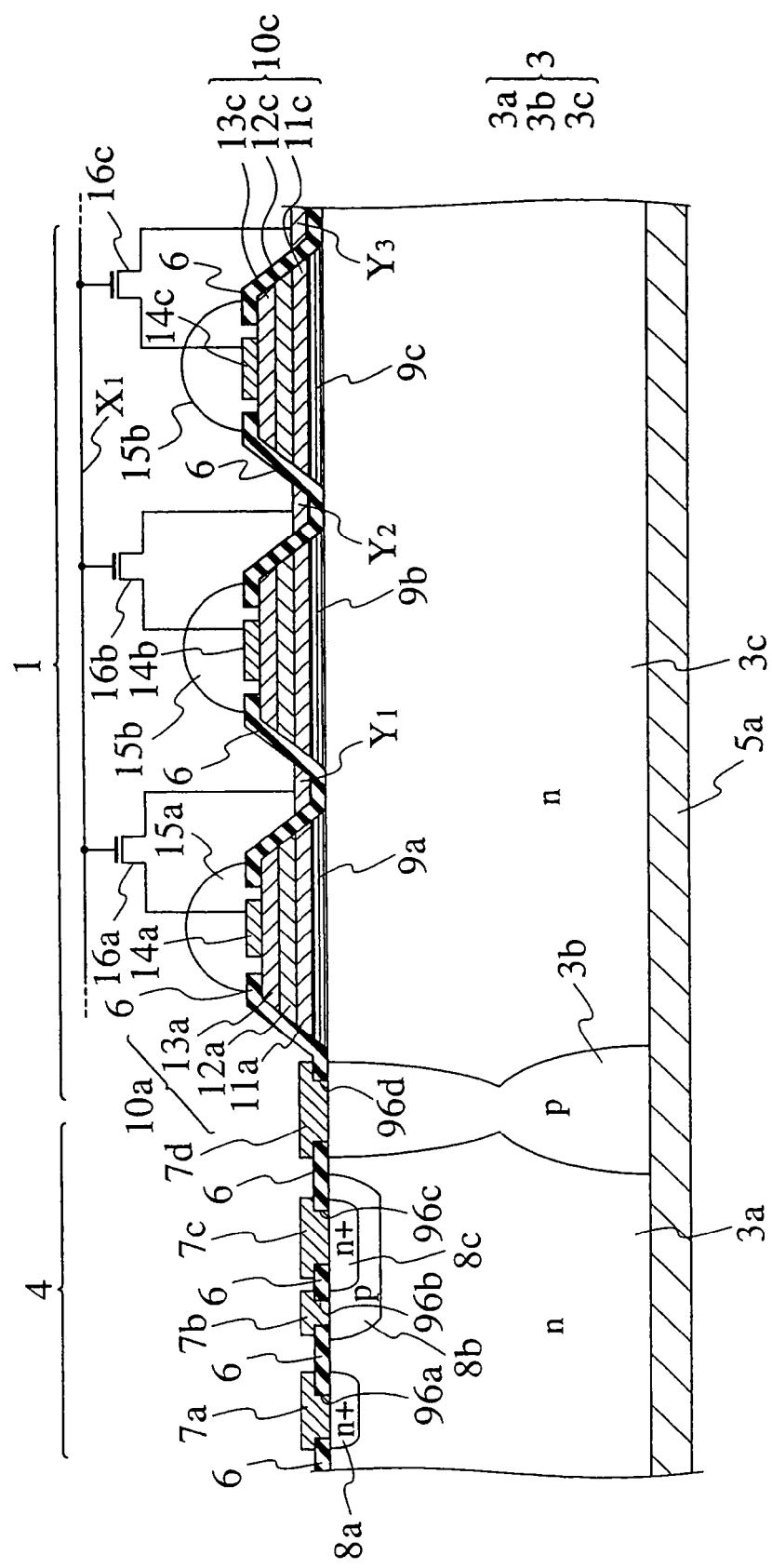
FIG. 7 is a sectional view for explaining a semiconductor light-emitting device and a light-emitting display according to a second embodiment of the present invention.
Figure 8:
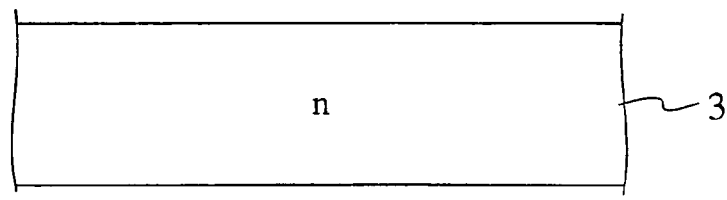
FIGS. 8 and 9 are sectional views for explaining a method for manufacturing the semiconductor light-emitting device and the light-emitting display according to the second embodiment of the present invention.
Figure 8:
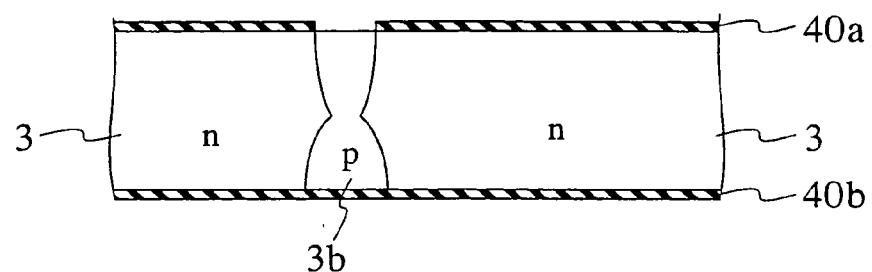
Figure 8:
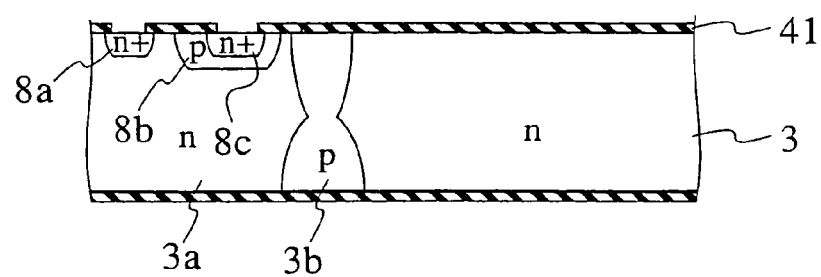
Figure 8:
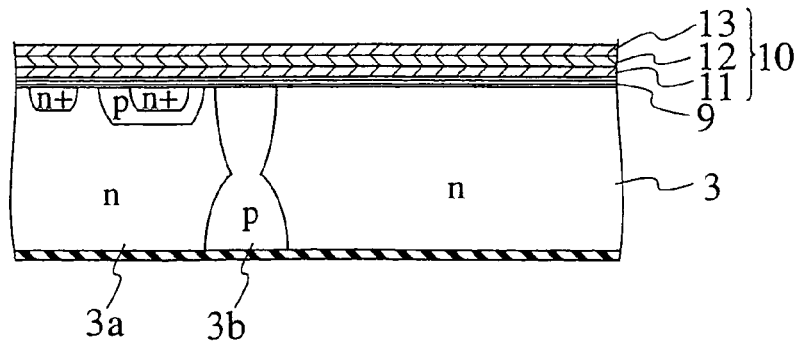
Figure 9:
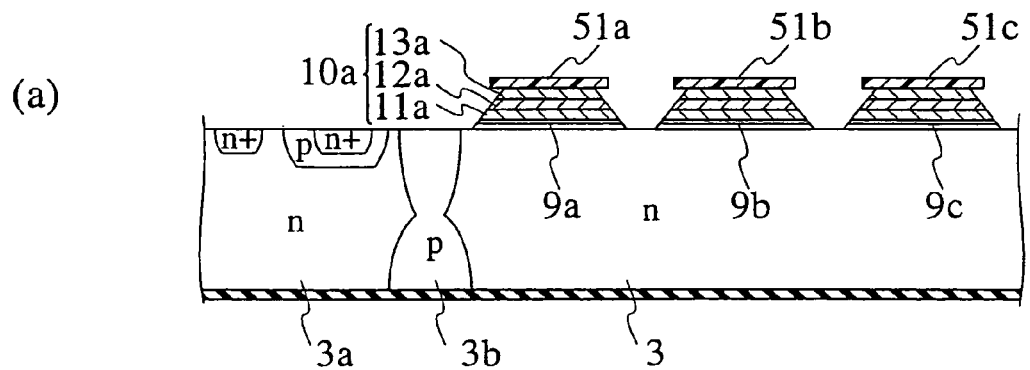
Figure 9:
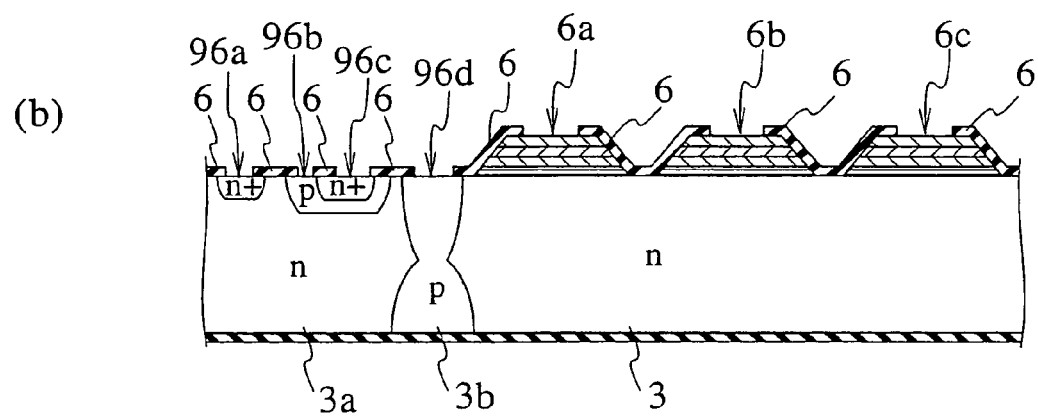
Figure 9:
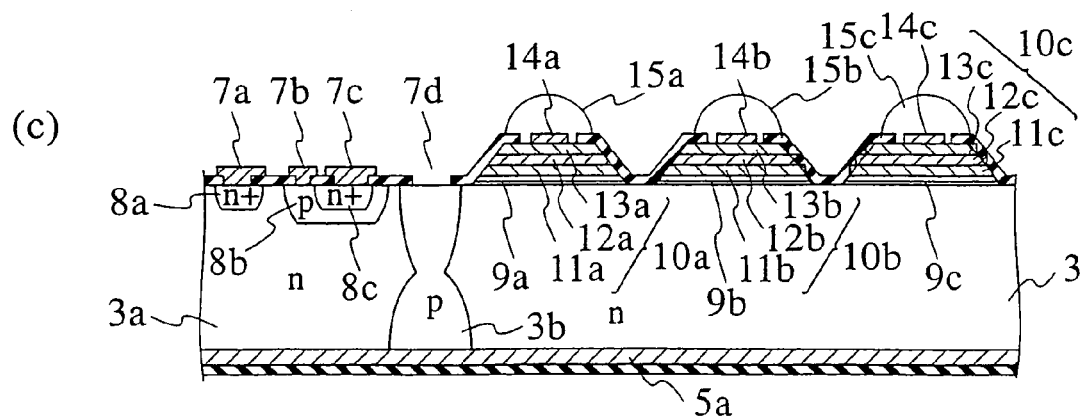

In a light-emitting display according to a second embodiment of the present invention, a driving circuit section $4a$ is monolithically integrated in the same wafer as that of a light-emitting display section 1, as shown in FIG. 7. The light-emitting display section 1 has substantially the same structure and function as that of the light-emitting display according to the first embodiment of the present invention shown in FIG. 1. Moreover, the driving circuit section $4a$ has substantially the same structure and function as that of the driving circuit 4 shown in FIG. 3.

As shown in FIG. 7, the light-emitting display according to the second embodiment of the present invention includes a substrate 3, a plurality of (first to third) light-emitting-element-layers $10a$, $10b$ and $10c$ made of semiconductor materials which are formed on the substrate 3 so as to be isolated from each other and which have wider band gaps than the substrate 3, and first to third phosphors $15a$, $15b$ and $15c$ for converting the wavelengths of the lights from the first to third light-emitting-element-layers $10a$, $10b$ and $10c$ into other wavelengths. FIG. 7 shows a semiconductor light-emitting device which includes the first to third light-emitting-element-layers $10a$, $10b$ and $10c$ and the first to third phosphors $15a$, $15b$ and $15c$ constituting one unit picture element (pixel). However, in addition to those shown in FIG. 7, there are first light-emitting-element-layers $10a$, $10e$, . . . , first phosphors $15a$, $15e$, . . . , second light-emitting-element-layers $10b$, $10f$, . . . , second phosphors $15b$, $15f$, . . . , third light-emitting-element-layers $10c$, $10d$, . . . , and the third phosphors $15c$, $15d$, . . . , similar to the first embodiment of the present invention.

In the light-emitting display according to the second embodiment of the present invention, the substrate 3 is electrically separated into a driving IC area $3a$ and a light-emitting device formation area $3c$ by an inactive area (element isolation area) $3b$. A cathode electrode $5a$ is placed on the lower surfaces (second main surfaces) of the driving IC area $3a$ and the light-emitting device formation area $3c$. A silicon oxide film 6 is placed to cover exposed portions of the surfaces (first main surfaces) of the driving IC area $3c$ and the inactive area $3b$. Contact holes $96a$, $96b$, $96c$, $96d$, . . . are opened in the silicon oxide film 6 on the driving IC area $3a$, and electrodes $7a$, $7b$, $7c$, $7d$, . . . made of metal films of Al, AlNi, or the like are connected to an n-type collector area $8a$, a p-type base area $8b$, an n-type emitter area $8c$, and the inactive area (element isolation area) $3b$ through the contact holes $96a$, $96b$, $96c$, $96d$, . . . .

In the driving IC area $3a$, various electronic circuits including the scan signal circuit 61 and the data signal circuit 62 are integrated (see FIG. 3). These electronic circuits are bipolar integrated circuits and MIS integrated circuits in which a large number of p-type and n-type impurity implantation areas form a fine and complex geometrical arrangement. FIG. 7 schematically shows a part of the geometric arrangement where the p-type base area $8b$ is provided, the n-type emitter area $8c$ is provided in the p-type base area $8b$, and the n-type collector area $8a$ is provided spaced from the base area $8b$. Furthermore, bipolar transistors having npn structures are shown, in which the collector electrode $7a$, the base electrode $7b$, and the emitter electrode $7c$ are provided in the collector area $8a$, the base area $8b$, and the emitter area $8c$, respectively. The structure of the light-emitting device formation area $3c$ is substantially the same as that of the light-emitting display body according to the first embodiment of the present invention and thus no further description thereof is provided. In FIG. 7, the cathode electrode $5a$ is placed on the back surface (second main surface) of the substrate 3. However, it does not matter whether or not the cathode electrode is provided at the bottom of the driving IC area $3a$ and the inactive area $3b$ as needed.

In the light-emitting display according to the second embodiment of the present invention, signal voltages are applied to TFTs $16a$, $16b$, $16c$, . . . by the driving circuit section $4a$ monolithically integrated in the same wafer as that of the light-emitting display section 1, instead of the driving circuit 4 electrically connected to the light-emitting display from outside through bonding wires or the like, as in the first embodiment of the present invention. Apart from the above, the driving method of the second embodiment of the present invention is substantially the same as that of the light-emitting display body according to the first embodiment of the present invention, and thus no further description thereof is provided.

As described earlier, with the light-emitting display according to the first embodiment of the present invention, display speed can be enhanced, longevity can be increased, and environmental resistance and reliability can also be improved by converting the wavelengths of light from the first to third light-emitting-element-layers 10a, 10b, 10c, . . . into first, second, and third wavelengths different from the foregoing wavelengths through the first to third phosphors 15a, 15b, 15c, . . . .

Further, provision of the first to third phosphors 15a, 15b, 15c, . . . eliminates the necessity of color filters and achieves an extremely small loss of light. In addition, manufacturing processes can be simplified, achieving cost reduction.

Moreover, a high level of miniaturization of an element can be achieved by providing the driving IC area 3a for driving the light-emitting display of the present invention and for controlling the light emission from the light-emitting-element-layers 10a, 10b, 10c, . . . and by installing an electronic circuit which configures the driving circuit section 4a and the like, which includes a semiconductor device different from a semiconductor light-emitting device. Furthermore, elements including the TFTs 16a, 16b, 16c, . . . can also be provided in the surface of the substrate 3.

The light-emitting display body according to the second embodiment of the present invention shown in FIG. 7 can be manufactured in the following procedure.

(a) As shown in FIG. 8(a), the substrate 3 made of n-type silicon is prepared. Next, insulating films 40a and 40b made of silicon oxide films ($SiO_2$ films) or the like are formed on the lower and upper surfaces of the substrate 3 by thermal oxidation or the like. Resist is then applied onto the top of the insulating film 40b. Furthermore, an etching mask of the resist is delineated by lithography technology. By RIE or the like in which this etching mask is used, part of the insulating film 40b is selectively etched to be removed. By using the patterned insulating film 40b as a mask, a p-type impurity area of boron ($B^+$) or the like, is selectively implanted. Similarly, resist is applied to the insulating film 40a, and an etching mask of the resist is delineated by lithography technology. By RIE or the like in which this etching mask is used, part of the insulating film 40a is selectively etched to be removed as shown in FIG. 8(b). By using the patterned insulating film 40 as a mask, a p-type impurity area is selectively implanted and then heat-treated (drive-in), whereby the inactive area (element isolation area) 3b for electrically isolating the light-emitting device formation area 3c and the driving IC area 3a is formed.

(b) After the heat treatment (drive-in), the insulating film 40a is removed, and a new oxide film (insulating film) 41 is formed on the surface of the substrate 3 by thermal oxidation. Then, resist is applied to the top of the insulating film 41, and an etching mask of the resist is delineated by lithography technology. By RIE or the like in which this etching mask is used, part of the insulating film 41 is selectively etched to be removed. By using this patterned insulating film 41 as a mask, the p-type base area 8b is formed by the ion implantation of p-type impurity ions and subsequent heat treatment. Furthermore, new resist is applied onto the top of insulating film 41, and an etching mask of the resist is delineated by lithography technology.

By RIE or the like in which this etching mask is used, part of the insulating film 41 is selectively etched to be removed. By using this patterned insulating film 41 and the resist on the top of the p-type base area 8b as an ion implantation mask, the $n^+$ type collector area 8a and the $n^+$ type emitter area 8c are formed by the ion implantation of n-type impurity ions and subsequent heat treatment as shown in FIG. 8(c). Thus, FIG. 8(c) is part of an integrated electronic circuit. In practice, a large number of unillustrated bipolar transistors, MIS transistors and the like are integrated.

(c) Next, as shown in FIG. 8(d), more specifically, as shown in FIG. 4, a DBR 9 is deposited on the substrate 3 by MOCVD or the like. Subsequently, an n-type cladding layer 11, a non-doped active layer 12, and a p-type cladding layer 13 are sequentially superimposed on the DBR 9, thus forming a light-emitting layer 10. Resist 51 is then applied onto the p-type cladding layer 13 by spin coating, and this resist 51 is patterned by photolithography technology. By using the patterned resist 51a, 51b, 51c, . . . as an etching mask, the light-emitting layer 10 and the DBR 9 are etched until the substrate 3 is exposed, by wet etching or the like. In the wet etching, for example, a $HCl/HNO_3$ solution, a NaOH solution, a KOH solution, or the like is used as an etching solution. As a result, as shown in FIG. 9(a), the DBR 9 is divided into a plurality of DBRs 9a, 9b, 9c, . . . , and the light-emitting layer 10 is divided into a first light-emitting-element-layer 10a on the DBR 9a, a second light-emitting-element-layer 10b on the DBR 9b, and a third light-emitting-element-layer 10c on the DBR 9c. At this time, the surface of the substrate 3 in the driving IC area 3a is exposed.

(d) Next, a silicon oxide film 6 is deposited by CVD to cover the entire surface of the substrate 3. By using resist (not shown) as an etching mask, the silicon oxide film 6 is patterned by lithography technology. Thus, the contact holes 96a to 96c, . . . are formed in the driving IC area 3a, and the windows 6a, 6b, 6c, . . . are formed in the light-emitting device formation area 3c, as shown in FIG. 9(b).

(e) Subsequently, in order to use the lift-off method, new resist is applied onto the silicon oxide film 6, the contact holes 96a to 96c, . . . , and the windows 6a, 6b, 6c, . . . and patterned by lithography technology. Thereafter, refractory metal, such as W, Ti, or Mo, silicide thereof ($WSi_2$, $TiSi_2$, or $MoSi_2$) or the like is deposited by vacuum deposition, sputtering or the like. Subsequently, the resist is lifted off, thereby forming the collector electrode 7a, the base electrode 7b, the emitter electrode 7c, and the inactive area electrode 7d which are in low-resistance ohmic contact with the n-type collector area 8a, the p-type base area 8b, the n-type emitter area 8c, and the inactive area (element isolation area) 3b, respectively. Thereafter, another new resist is applied to the silicon oxide film 6, the contact holes 96a to 96c, . . . , and the windows 6a, 6b, 6c, . . . and patterned by lithography technology. A metal film of Au—Ni alloy or the like is then thinly deposited by vacuum deposition, sputtering, or the like to be optically transparent. Subsequently, the new resist is lifted off, thereby forming anode electrodes 14a, 14b, 14c, . . . which are in low-resistance ohmic contact with the p-type cladding layers 13a, 13b, 13c, . . . .

(f) Next, a thin refractory metal film is deposited on the surface of the wafer by sputtering or the like. Then, by using resist (not shown) as an etching mask formed by lithography technology, gate electrode lines $X_1$, $X_2$, $X_3$, . . . (FIG. 2) are formed on grooves 31a, 32b, . . . (FIG. 2) by RIE or the like. These gate electrode lines $X_1$, $X_2$, $X_3$, . . . are formed to be extended to the driving circuit section 4a, and electrically connected to the driving circuit section 4a (not shown).

Next, first interlayer insulating films 17a to 17i, . . . are deposited on the gate electrode lines $X_1$, $X_2$, $X_3$, . . . (FIG. 2) by CVD (not shown). Subsequently, a new thin refractory metal film is deposited on the entire upper surfaces of the first interlayer insulating films by sputtering or the like. Thereafter, an etching mask of resist is delineated by lithography technology. By RIE or the like in which this etching mask is used, source electrode lines $Y_1$, $Y_2$, $Y_3$, . . . are formed along grooves 32a, 32b, 32c, . . . as shown in FIG. 9(c). At this time, the source electrode lines $Y_1$, $Y_2$, $Y_3$, . . . are formed to be extended to the data signal circuit 62, and electrically connected to the data signal circuit 62.

(g) Next, a second interlayer insulating film (not shown) is deposited on the source electrode lines $Y_1$, $Y_2$, $Y_3$, . . . by CVD. Thereafter, an etching mask of resist is delineated by lithography technology. By RIE or the like in which this etching mask is used, anode contact holes for partially exposing the anode electrodes 14a, 14b, 14c, . . . and source contact holes for partially exposing the source electrode lines $Y_1$, $Y_2$, $Y_3$, . . . are opened in part of the second interlayer insulating film. The subsequent step of forming TFTs is the same as that of the first embodiment of the present invention and therefore will not be further described. The gate electrodes of the TFTs 16a, 16b, 16c, . . . are connected to the gate electrode lines $X_1$, $X_2$, $X_3$, . . . , respectively. Moreover, the source electrodes of the TFTs 16a, 16b, 16c, . . . are respectively connected to the source electrode lines $Y_1$, $Y_2$, $Y_3$, . . . , and the drain electrodes thereof are respectively connected to the anode electrodes 14a, 14b, 14c, . . . . Furthermore, a third interlayer insulating film (not shown) is deposited on the gate electrodes of the TFTs by CVD. Thereafter, Al, Al—Ni alloy, or the like is deposited on the back surface (second main surface) of the substrate 3 by vacuum deposition, sputtering, or the like, thus forming a cathode electrode 5.

(h) Next, in order to use the lift-off method, new resist is applied onto the third interlayer insulating film and patterned by lithography technology. Thereafter, fluorescent material is deposited by vacuum deposition, sputtering, or the like. Subsequently, the resist is lifted off, thereby forming the first phosphor 15a on the first light-emitting-element-layer 10a, the second phosphor 15b on the second light-emitting-element-layer 10b, and the third phosphor 15c on the third light-emitting-element-layer 10c as shown in FIG. 9(c). Finally, the substrate 3 is mounted on a package, thus completing the light-emitting display according to the second embodiment of the present invention shown in FIG. 7.

The method of manufacturing the light-emitting display according to the second embodiment of the present invention is an example. As a matter of course, the light-emitting display body can be achieved by various manufacturing methods other than this.

THIRD EMBODIMENT

Figure 10:
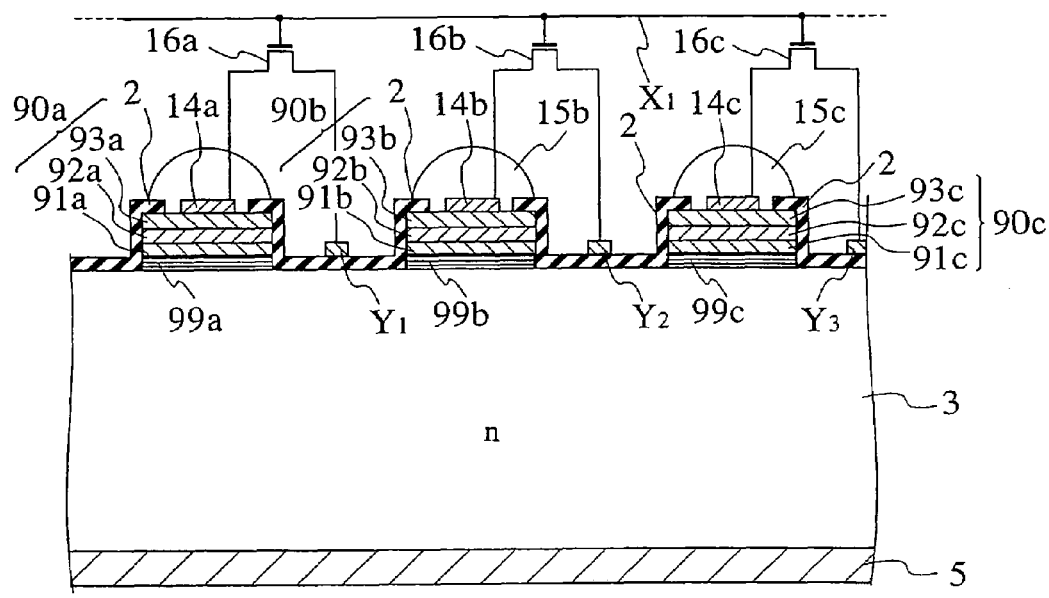
FIG. 10 is a sectional view for explaining a semiconductor light-emitting device and a light-emitting display according to a third embodiment of the present invention.

As shown in FIG. 10, the light-emitting display according to the third embodiment of the present invention includes a substrate 3, a plurality of (first to third) light-emitting-element-layers 90a, 90b and 90c made of semiconductor materials which are formed on the substrate 3 so as to be isolated from each other and which have wider band gaps than the substrate 3, first to third phosphors 15a, 15b and 15c are provided for converting the wavelengths of the lights from the first to third light-emitting-element-layers 90a, 90b and 90c into other wavelengths. FIG. 10 shows a semiconductor light-emitting device which includes the first to third light-emitting-element-layers 90a, 90b and 90c and the first to third phosphors 15a, 15b and 15c constituting one unit picture element (pixel). However, in addition to those shown in FIG. 10, there are first light-emitting-element-layers 90a, 90e, . . . , first phosphors 15a, 15e, . . . , second light-emitting-element-layers 90b, 90f, . . . , second phosphors 15b, 15f, . . . , third light-emitting-element-layers 90c, 90d, . . . , and the third phosphors 15c, 15d, . . . , similar to the first embodiment of the present invention.

The light-emitting-element-layers 90a, 90b, 90c, . . . , and DBRs 99a, 99b, 99c, . . . have vertical sidewalls. The light-emitting-element-layers 90a, 90b, 90c, . . . and DBRs 99a, 99b, 99c, . . . have subsequently the same functions as the light-emitting-element-layers 10a, 10b, 10c, . . . and DBRs 9a, 9b, 9c, . . . according to the first and second embodiments of the present invention. The silicon oxide film 2 is placed to cover exposing portion of the substrate 3, the light-emitting-element-layers 90a, 90b, 90c, . . . and DBRs 99a, 99b, 99c, . . . . Apart from the above, the third embodiment has substantially the same structure as that of first embodiment of the present invention, and therefore will not be further described.

As described earlier, with the light-emitting display according to the third embodiment of the present invention, display speed can be enhanced, longevity can be increased, and environmental resistance and reliability can also be improved by converting the wavelengths of light from the first to third light-emitting-element-layers 90a, 90b, 90c, . . . into first, second, and third wavelengths different from the foregoing wavelengths through the first to third phosphors 15a, 15b, 15c, . . . .

Further, provision of the first to third phosphors 15a, 15b, 15c, . . . eliminates the necessity of color filters and achieves an extremely small loss of light. In addition, manufacturing processes can be simplified, achieving cost reduction.

In the method for manufacturing a light-emitting display according to the third embodiment of the present invention, forming the light-emitting-element-layers 90a, 90b, 90c, . . . and DBRs 99a, 99b, 99c, . . . isolated respectively with grooves of the vertical sidewalls by etching with RIE, instead of wet etching the light-emitting layer 10 and the DBR 9 is different from the method for manufacturing of the first embodiment of the present invention. Apart from the above, the method for manufacturing the light-emitting display is substantially the same as that of the first embodiment of the present invention, and therefore will not be further described.

FOURTH EMBODIMENT

Figure 11:
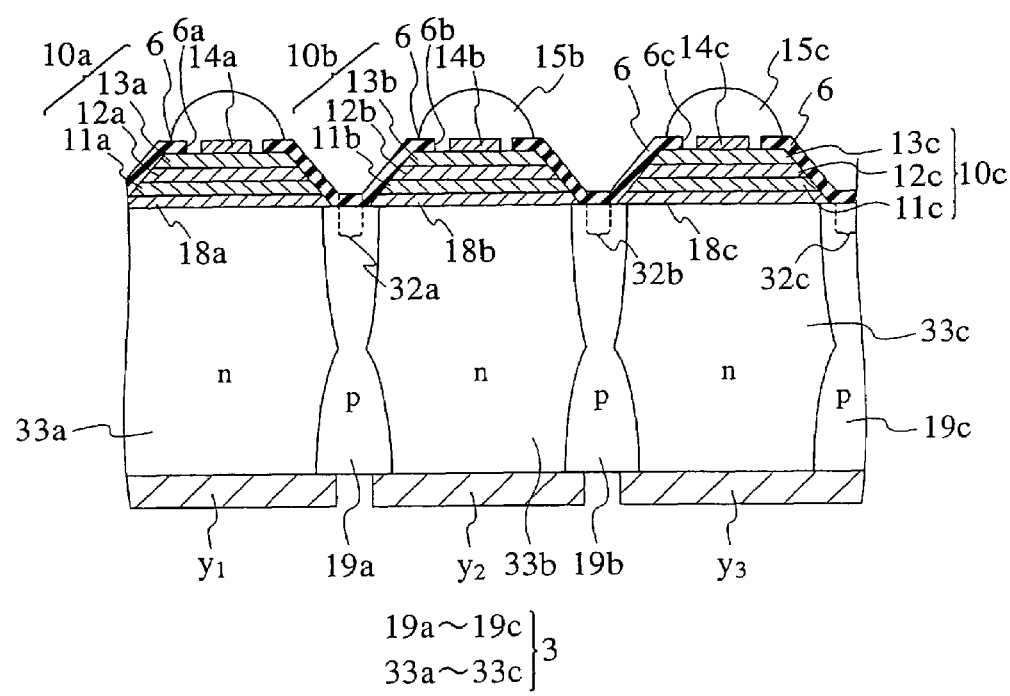
FIG. 11 is a sectional view for explaining a semiconductor light-emitting device and a light-emitting display according to a fourth embodiment of the present invention (sectional view along I-I shown in FIG. 12).

As for an example of a light-emitting display according to a fourth embodiment of the present invention, a simple matrix circuit will be described. That is, as shown in FIG. 11, the light-emitting display according to the fourth embodiment of the present invention includes a substrate 3, a plurality of (first to third) light-emitting-element-layers 10a, 10b and 10c made of semiconductor materials which are formed on the substrate 3 so as to be isolated from each other and which have wider band gaps than the substrate 3, and first to third phosphors 15a, 15b and 15c are provided for converting the wavelengths of the lights from the first to third light-emitting-element-layers 10a, 10b and 10c into different wavelengths. FIG. 11 shows a semiconductor light-emitting device which includes the first to third light-emitting-element-layers 10a, 10b and 10c and the first to third phosphors 15a, 15b and 15c constituting one unit picture element (pixel). However, in addition to those shown in FIG. 11, there are first light-emitting-element-layers 10a, 10e, . . . , first phosphors 15a, 15e, . . . , second light-emitting-element-layers 10b, 10f, . . . , second phosphors 15b, 15f, . . . , third light-emitting-element-layers 10c, 10d, . . . , and the third phosphors 15c, 15d, . . . , similar to the first embodiment of the present invention.

Furthermore, in the light-emitting display according to the fourth embodiment of the present invention, reflective metal films 18a, 18b, 18c, . . . are placed between the substrate 3 and the first to third light-emitting-element-layers 10a, 10b, 10c, . . . , respectively. Aluminum or the like can be used for the reflective metal films 18a, 18b, 18c, . . . . By providing the reflective metal films 18a, 18b, 18c, . . . , the reflective metal films 18a, 18b, 18c, . . . serve as reflecting mirrors, thus increasing light-emitting efficiency. Moreover, the light-emitting display further includes the following: a silicon oxide film 6 placed to cover exposed portions of the substrate 3, exposed portions of the reflective metal films 18a, 18b, 18c, . . . , and exposed portions of the first to third light-emitting-element-layers 10a, 10b, 10c, . . . ; and anode electrodes 14a, 14b, 14c, . . . placed within windows 6a, 6b, 6c, . . . of the silicon oxide film 6 on the first to third light-emitting-element-layers 10a, 10b, 10c, . . . .

The substrate 3 includes light-emitting device formation areas 33a to 33c electrically isolated by inactive areas (element isolation areas) 19a to 19c. The first to third light-emitting-element-layers 10a, 10b, 10c, . . . and the reflective metal films 18a, 18b, 18c, . . . are placed on the light-emitting device formation areas 33a to 33c. Moreover, data electrode lines $y_1$, $y_2$, $y_3$, . . . are provided on the back surfaces (second main surfaces) of the light-emitting device formation areas 33a to 33c, respectively.

Figure 12:
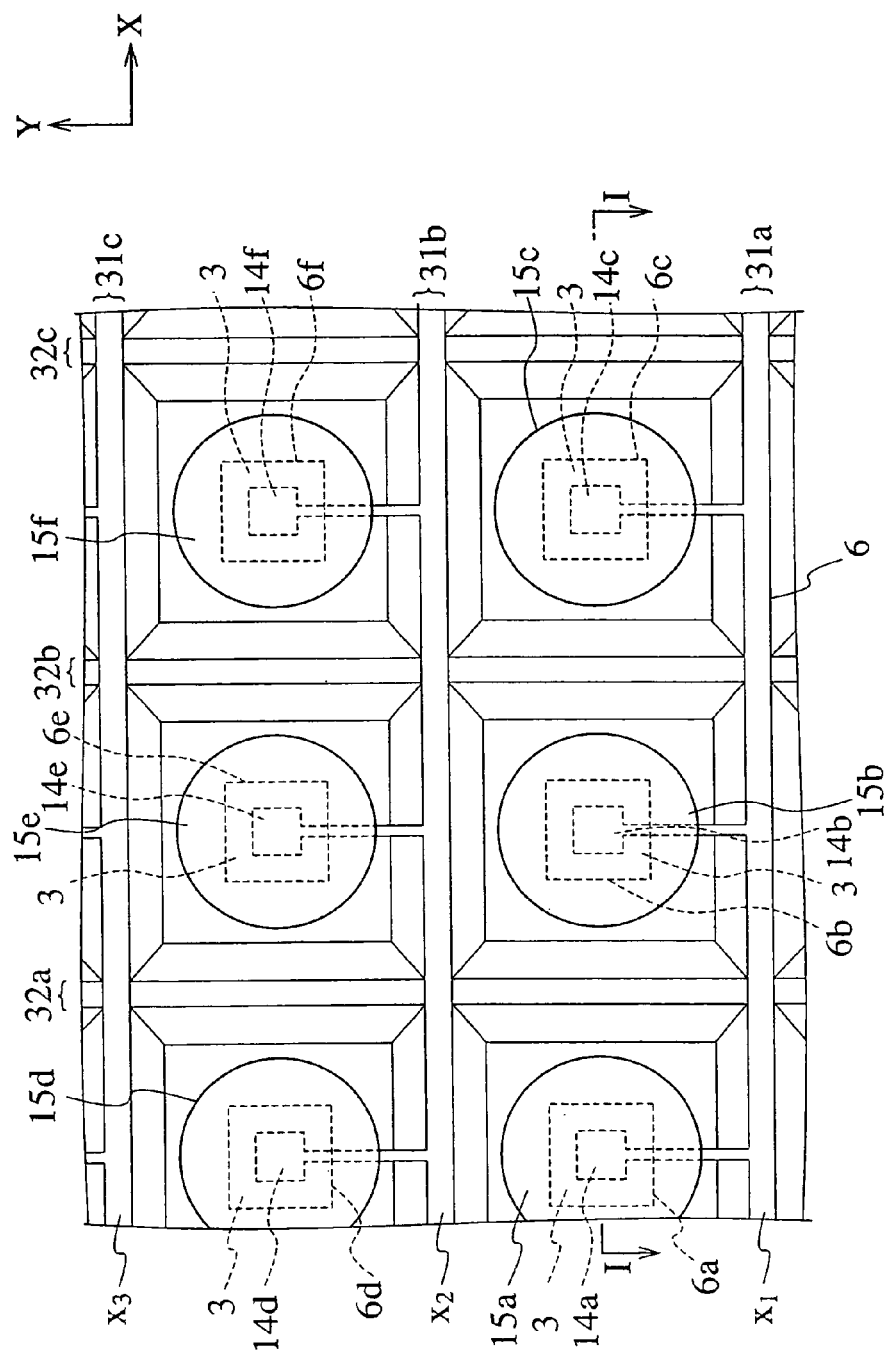
FIG. 12 is a plan view for explaining the semiconductor light-emitting device and the light-emitting display according to the fourth embodiment of the present invention.
Figure 13:
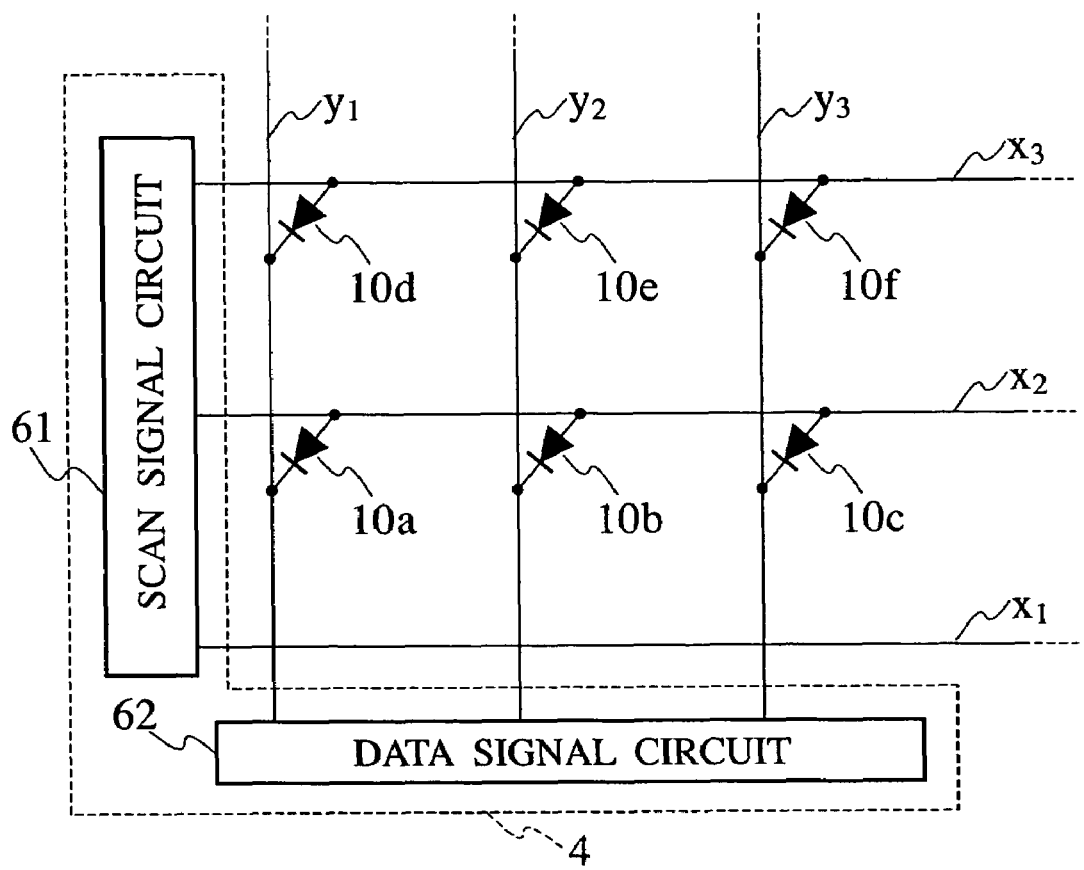
FIG. 13 is a partial equivalent circuit of the semiconductor light-emitting device and the light-emitting display according to the fourth embodiment of the present invention.
Figure 14:
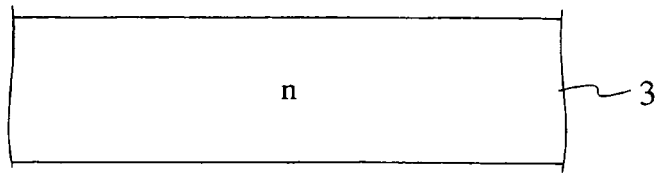
FIGS. 14 and 15 are sectional views for explaining a method for manufacturing the semiconductor light-emitting device and the light-emitting display according to the fourth embodiment of the present invention.
Figure 14:
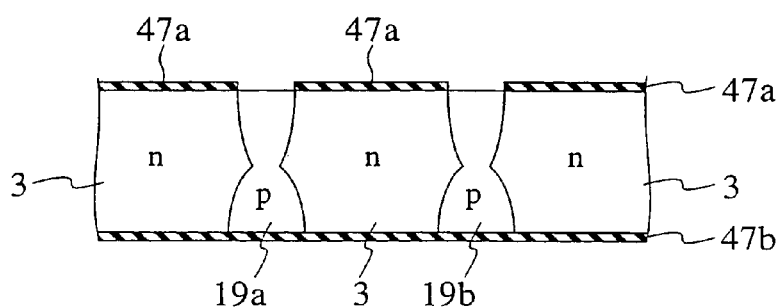
Figure 14:
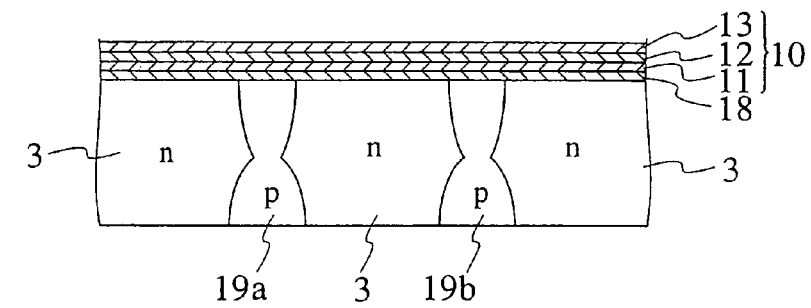
Figure 15:
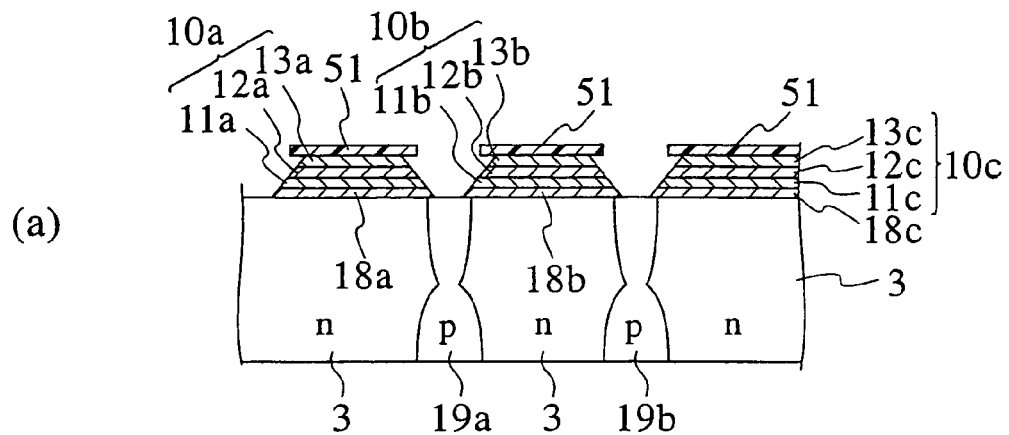
Figure 15:
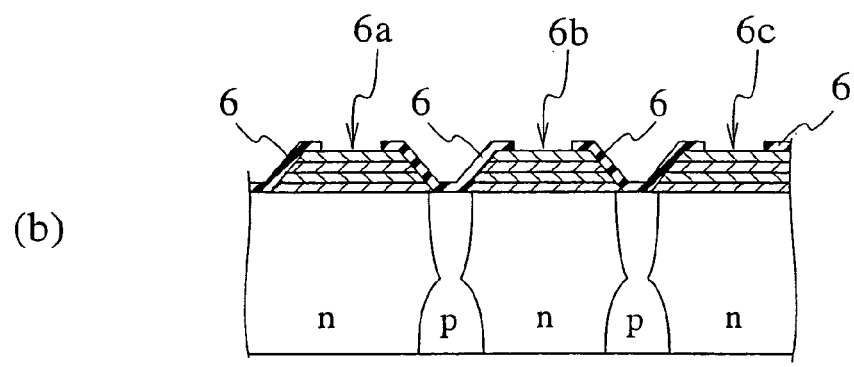
Figure 15:
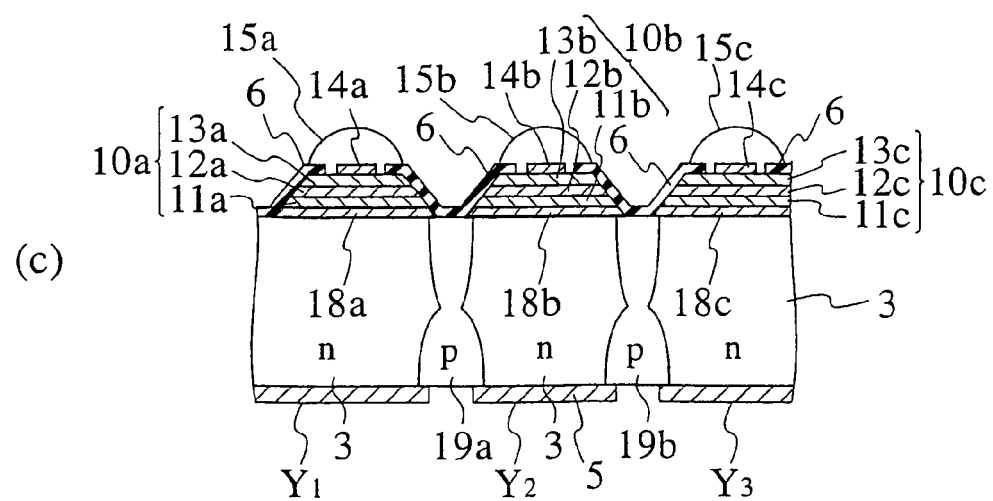

As shown in FIG. 12, the first to third light-emitting-element-layers 10a, 10b, 10c, . . . and the reflective metal films 18a, 18b, 18c, . . . are delimited in a mesh pattern by a plurality of grooves 31a, 31b, 31c, . . . running parallel to each other in the X-axis direction and a plurality of grooves 32a, 32b, 32c, . . . running parallel to each other in the Y-axis direction orthogonal to the plurality of grooves 31a, 31b, 31c, . . . . Moreover, the first to third phosphors 15a to 15f, . . . are regularly placed to cover the respective windows 6a to 6f, . . . for guiding light out, thus constituting a dot-matrix full-color light-emitting display. Accordingly, a matrix is constituted by a plurality of scan electrode lines $x_1$, $x_2$, $x_3$, . . . running in the horizontal direction and a plurality of data electrode lines $y_1$, $y_2$, $y_3$, . . . , shown in FIG. 11, which run parallel to each other in the vertical direction to be orthogonal to the scan electrode lines $x_1$, $x_2$, $x_3$, . . . . As shown in FIG. 12, the plurality of scan electrode lines $x_1$, $x_2$, $x_3$, . . . are placed in the grooves 31a, 31b, 31c, . . . on the silicon oxide film 6, respectively, and have a wiring thickness of approximately 100 nm. The respective picture elements are placed at the intersections of this matrix. As shown in FIG. 13, the plurality of scan electrode lines $x_1$, $x_2$, $x_3$, . . . are connected to a scan signal circuit 61, and the plurality of data electrode lines $y_1$, $y_2$, $y_3$, . . . are connected to a data signal circuit 62. The scan signal circuit 61 and the data signal circuit 62 constitute a driving circuit 4.

The driving method of the light-emitting display according to the fourth embodiment of the present invention is a passive matrix drive. For example, in FIG. 13, the scan electrode lines $x_1$, $x_2$, $x_3$, . . . are sequentially scanned by the scan signal circuit 61. By applying signal voltages corresponding to the source electrode lines $y_1$, $y_2$, $y_3$, . . . from the data signal circuit 62 at a moment of scanning, the light-emitting-element-layers 10a to 10f, . . . to which the signal voltages are applied emit light.

As described earlier, with the light-emitting display according to the fourth embodiment of the present invention, display speed can be enhanced, longevity can be increased, and environmental resistance and reliability can also be improved by converting the wavelengths of light from the first to third light-emitting-element-layers 10a, 10b, 10c, . . . into first, second, and third wavelengths different from the foregoing wavelengths through the first to third phosphors 15a, 15b, 15c, . . . .

Further, provision of the first to third phosphors 15a, 15b, 15c, . . . eliminates the necessity of color filters and achieves an extremely small loss of light. In addition, manufacturing processes can be simplified, achieving cost reduction.

The light-emitting display body according to the fourth embodiment of the present invention shown in FIG. 11 can be manufactured in the following procedure.

(a) As shown in FIG. 14(a), the substrate 3 made of n-type silicon is prepared. Next, insulating films 47a and 47b made of silicon oxide films ($SiO_2$ films) or the like are formed on the lower and upper surfaces of the substrate 3 by thermal oxidation or the like. Resist is then applied onto the top of the insulating film 47b. Furthermore, an etching mask of the resist is delineated by lithography technology. By RIE or the like in which this etching mask is used, part of the insulating film 47b is selectively etched to be removed. By using the patterned insulating film 47b as a mask, a p-type impurity area of $B^+$ or the like, is selectively implanted. Similarly, resist is applied to the insulating film 47a, and an etching mask of the resist is delineated by lithography technology. By RIE or the like in which this etching mask is used, part of the insulating film 47a is selectively etched to be removed as shown in FIG. 14(b). By using the patterned insulating film 47 as a mask, a p-type impurity area is selectively implanted and then heat-treated (drive-in), whereby the inactive area (element isolation area) 19a, 19b, . . . for electrically isolating the substrate 3 is formed. Thereafter, the isolating films 47a and 47b are removed by HF or the like.

(b) Next, as shown in FIG. 14(c), a reflective metal film 18 is formed on the substrate 3 by vacuum deposition or sputtering. Subsequently, an n-type cladding layer 11, a non-doped active layer 12, and a p-type cladding layer 13 are sequentially superimposed on the reflective metal film 18, thus forming a light-emitting layer 10. Resist 51 is then applied onto the p-type cladding layer 13 by spin coating, and this resist 51 is patterned by photolithography technology. By using the patterned resist 51 as an etching mask, the light-emitting layer 10 and the DBR 9 are etched until the substrate 3 is exposed, by wet etching or the like. In the wet etching, for example, a $HCl/HNO_3$ solution, a NaOH solution, a KOH solution, or the like is used as an etching solution. As a result, as shown in FIG. 15(a), the reflective metal film 18 is divided into a plurality of reflective metal films 18a, 18b, 18c, . . . , and the light-emitting layer 10 is divided into a first light-emitting-element-layer 10a on the reflective metal films 18a, a second light-emitting-element-layer 10b on the reflective metal films 18b, and a third light-emitting-element-layer 10c on the reflective metal films 18c, . . . .

(c) Next, a silicon oxide film 6 is deposited by CVD to cover the entire surface of the substrate 3. By using resist (not shown) as an etching mask, the silicon oxide film 6 is patterned by lithography technology. Thus, the windows 6a, 6b, 6c . . . are formed in the light-emitting device formation area 3c, as shown in FIG 15(b).

(d) Next, in order to use the lift-off method, another new resist is applied to the silicon oxide film 6, and the windows 6a, 6b, 6c, . . . and patterned by lithography technology. A metal film of Au—Ni alloy or the like is then thinly deposited by vacuum deposition, sputtering, or the like to be optically transparent. Subsequently, the new resist is lifted off, thereby forming anode electrodes 14a, 14b, 14c, . . . which are in low-resistance ohmic contact with the p-type cladding layers 13a, 13b, 13c, . . . . Thereafter, a thin refractory metal film is deposited on the surface of the wafer by sputtering or the like. Then, by using resist (not shown) as an etching mask formed by lithography technology, scan electrode lines $x_1$, $x_2$, $x_3$, . . . (FIG. 12) are formed on grooves 31a, 32b, . . . (FIG. 12) by RIE or the like. These scan electrode lines $x_1$, $x_2$, $x_3$, . . . are formed to be extended to the scan signal circuit 61 shown in FIG. 13, and electrically connected to the scan signal circuit 61.

(e) Next, in order to use the lift-off method, new resist is applied to the back surface (the second main surface) of the substrate 3, and patterned by lithography technology. A metal film of Al, Al—Ni alloy or the like is then deposited by vacuum deposition, sputtering, or the like. Subsequently, the new resist is lifted off, thereby forming the scan electrode lines. An etching mask of the resist is delineated on the second main surface of the substrate 3 by lithography technology. By RIE or the like in which this etching mask is used, the data electrode lines $y_1$, $y_2$, $y_3$, . . . are formed as shown in FIG. 15(c). At this time, the data electrode lines $y_1$, $y_2$, $y_3$, are formed to be extended to the data signal circuit 62, and electrically connected to the data signal circuit 62.

(f) Next, in order to use the lift-off method, new resist is applied onto the third interlayer insulating film and patterned by lithography technology. Thereafter, fluorescent material is deposited by vacuum deposition, sputtering, or the like. Subsequently, the resist is lifted off, thereby forming a first phosphor 15a on the first light-emitting-element-layer 10a, a second phosphor 15b on the second light-emitting-element-layer 10b, and a third phosphor 15c on the third light-emitting-element-layer 10c as shown in FIG. 15(c). Finally, the substrate 3 is mounted on a package, thus completing the light-emitting display according to the fourth embodiment of the present invention.

The method of manufacturing the light-emitting display according to the fourth embodiment of the present invention is an example. As a matter of course, the light-emitting display body can be achieved by various manufacturing methods other than this.

FIFTH EMBODIMENT

Figure 16:
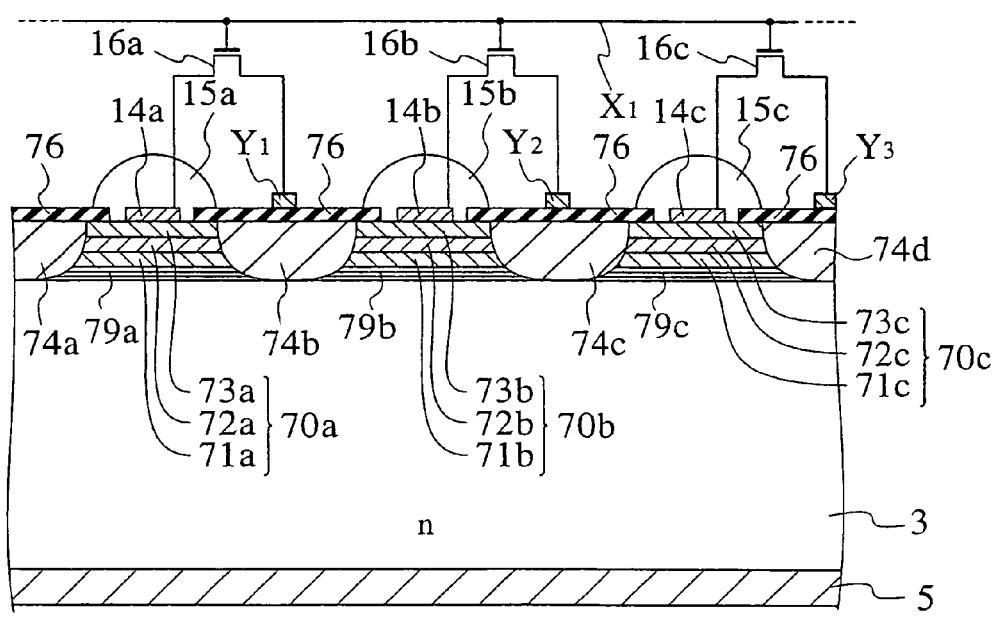
FIG. 16 is a sectional view for explaining a semiconductor light-emitting device and a light-emitting display according to a fifth embodiment of the present invention.

As shown in FIG. 16, the light-emitting display according to the fifth embodiment of the present invention includes a substrate 3, a plurality of (first to third) light-emitting-element-layers 70a, 70b and 70c made of semiconductor materials which are formed on the substrate 3 so as to be isolated from each other and which have wider band gaps than the substrate 3, and first to third phosphors 15a, 15b and 15c are provided for converting the wavelengths of the lights from the first to third light-emitting-element-layers 70a, 70b and 70c into different wavelengths. FIG. 16 shows a semiconductor light-emitting device which includes the first to third light-emitting-element-layers 70a, 70b and 70c and the first to third phosphors 15a, 15b and 15c constituting one unit picture element (pixel). However, in addition to those shown in FIG. 16, there are first light-emitting-element-layers 70a, 70e, . . . , first phosphors 15a, 15e, . . . , second light-emitting-element-layers 70b, 70f, . . . , second phosphors 15b, 15f, . . . , third light-emitting-element-layers 70c, 70d, . . . , and the third phosphors 15c, 15d, . . . , similar to the first embodiment of the present invention.

The first to the third light-emitting-element-layers 70a, 70b, 70c, . . . and DBRs 79a, 79b, 79c, . . . are delimited and electrically isolated from each other by element isolation areas 74a, 74b, 74c, . . . . The element isolation areas 74a, 74b, 74c, . . . are, for example, high-resistivity areas which are formed by applying a proton ($H^+$) or the like, or p-type semiconductor areas (opposite conductivity areas) which are formed by introducing $B^+$ or the like. The light-emitting-element-layers 70a, 70b, 70c, . . . and the DBRs 79a, 79b, 79c, . . . have substantially the same function as that of the light-emitting-element-layers 10a, 10b, 10c, . . . and the DBRs 9a, 9b, 9c, . . . according to the first and second embodiments of the present invention. A sillicon oxide film 76 is formed on the light-emitting-element-layers 70a, 70b, 70c, . . . and the element isolation areas 74a, 74b, 74c, . . . . Source electrode lines $Y_1$, $Y_2$, $Y_3$, which are similar in the first to the third embodiments are arranged on the sillicon oxide film 76. Apart from the above, the fifth embodiment is substantially the same as that of the first embodiment of the present invention, and thus no further description thereof is provided.

As described earlier, with the light-emitting display according to the fifth embodiment of the present invention, display speed can be enhanced, longevity can be increased, and environmental resistance and reliability can also be improved by converting the wavelengths of light from the first to third light-emitting-element-layers 70a, 70b, 70c, . . . into first, second, and third wavelengths different from the wavelengths through the first to third phosphors 15a, 15b, 15c, . . . .

Further, provision of the first to third phosphors 15a, 15b, 15c, . . . eliminates the necessity of color filters and achieves an extremely small loss of light. In addition, manufacturing processes can be simplified, achieving cost reduction.

Figure 17:
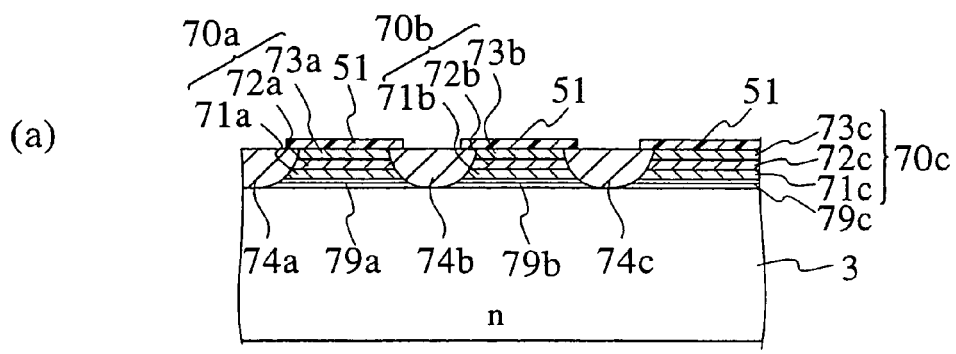
FIG. 17 is a sectional view for explaining a method for manufacturing the semiconductor light-emitting device and the light-emitting display according to the fifth embodiment of the present invention.
Figure 17:
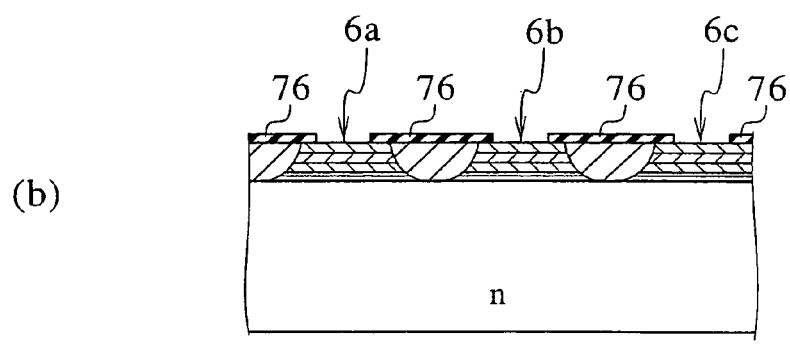
Figure 17:
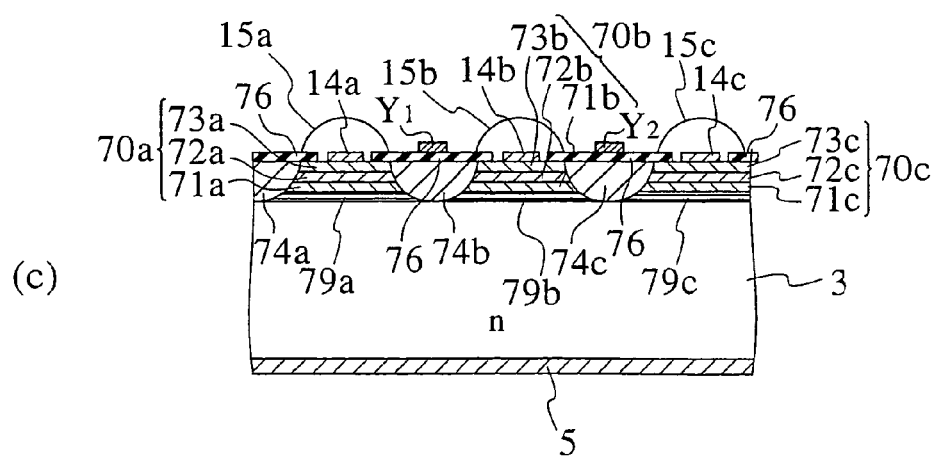

Next, with reference to FIGS. 5 and 17, a method of manufacturing the light-emitting display according to the fifth embodiment of the present invention will be described:

(a) First, as shown in FIG. 5(c), a DBR 9 is deposited on the substrate 3 by MOCVD or the like. Subsequently, an n-type cladding layer 11, a non-doped active layer 12, and a p-type cladding layer 13 are sequentially superimposed on the DBR 9, thus forming a light-emitting layer 10. The steps until here are substantially the same as that of the first embodiment of the present invention, and therefore will not be further described.

(b) Next, insulating films made of silicon oxide films ($SiO_2$ films) or the like are formed on the p-type cladding layer 13 by thermal oxidation or the like. Furthermore, an etching mask of the resist 51 is formed by lithography technology. By RIE or the like in which this etching mask is used, part of the insulating film is selectively etched to be removed. By using the patterned insulating film 51 as a mask, a p-type impurity area of $B^+$ or the like, is selectively implanted and then heat-treated (drive-in), whereby the element isolation areas 74a, 74b, 74c, . . . for electrically isolating each light-emitting device areas respectively are formed. By the element isolation areas 74a, 74b, 74c, . . . , the light-emitting layer 10 and the DBR 9 are divided into the first to the third light-emitting-element-layers 70a, 70b, 70c, . . . and DBRs 79a, 79b, 79c, . . . respectively. Note that the element isolation areas 74a, 74b, 74c, . . . which are high-resistively areas may be formed by irradiating a proton ($H^+$) or the like instead of implanting $B^+$ or the like.

(c) Next, a silicon oxide film 6 is deposited on the first main surface of the substrate 3 by CVD. By using resist (not shown) as an etching mask, the silicon oxide film 76 is patterned by lithography technology. Thus, the windows 6a, 6b, 6c, . . . are formed, as shown in FIG. 17(b). Subsequently, new resist is applied onto the silicon oxide film 76 and the windows 6a, 6b, 6c, . . . and patterned by lithography technology. Thereafter, a metal film of Au—Ni alloy or the like is then thinly deposited by vacuum deposition, sputtering, or the like to be optically transparent. Subsequently, the resist is lifted off, thereby forming anode electrodes 14a, 14b, 14c, . . . which are in low-resistance ohmic contact with the p-type cladding layers 13a, 13b, 13c, . . . .

(d) Next, a thin refractory metal film is deposited on the surface of the wafer by sputtering or the like. Then, by using resist (not shown) as an etching mask formed by lithography technology, unillustrated gate electrode lines are formed on the silicon oxide film 76 by RIE or the like. Next, an unillustrated first interlayer insulating films are deposited on the gate electrode lines by CVD. Subsequently, a new thin refractory metal film is deposited on the entire upper surfaces of the first interlayer insulating films by sputtering or the like. Thereafter, an etching mask of resist is delineated by lithography technology. By RIE or the like in which this etching mask is used, source electrode lines $Y_1$, $Y_2$, $Y_3$, . . . are formed as shown in FIG. 17(c).

(e) Next, an unillustrated second interlayer insulating film is deposited on the source electrode lines $Y_1$, $Y_2$, $Y_3$, . . . by CVD. Thereafter, an etching mask of resist is delineated by lithography technology. By RIE or the like in which this etching mask is used, anode contact holes for partially exposing the anode electrodes 14a, 14b, 14c, . . . and source contact holes for partially exposing the source electrode lines $Y_1$, $Y_2$, $Y_3$, . . . are opened in part of the second interlayer insulating film. The subsequent step of forming TFTs is the same as that of the first embodiment of the present invention and therefore will not be further described. The gate electrodes of the TFTs 16a, 16b, 16c, . . . are connected to the gate electrode lines $X_1$, $X_2$, $X_3$, . . . , respectively. Moreover, the source electrodes of the TFTs 16a, 16b, 16c, . . . are respectively connected to the source electrode lines $Y_1$, $Y_2$, $Y_3$, . . . , and the drain electrodes thereof are respectively connected to the anode electrodes 14a, 14b, 14c, . . . . Furthermore, a third interlayer insulating film (not shown) is deposited on the gate electrodes of the TFTs by CVD. Thereafter, Al, Al—Ni alloy, or the like is deposited on the back surface (second main surface) of the substrate 3 by vacuum deposition, sputtering, or the like, thus forming the cathode electrode 5.

(f) Next, in order to use the lift-off method, new resist is applied onto the third interlayer insulating film and patterned by lithography technology. Thereafter, fluorescent material is deposited by vacuum deposition, sputtering, or the like. Subsequently, the resist is lifted off, thereby forming the first phosphor 15a on the first light-emitting-element-layer 70a, the second phosphor 15b on the second light-emitting-element-layer 70b, and the third phosphor 15c on the third light-emitting-element-layer 70c as shown in FIG. 17(c). Finally, the substrate 3 is mounted on a package, thus completing the light-emitting display according to the fifth embodiment of the present invention shown in FIG. 16.

The method of manufacturing the light-emitting display according to the fifth embodiment of the present invention is an example. As a matter of course, the light-emitting display body can be achieved by various manufacturing methods other than this.

SIXTH EMBODIMENT

Figure 18:
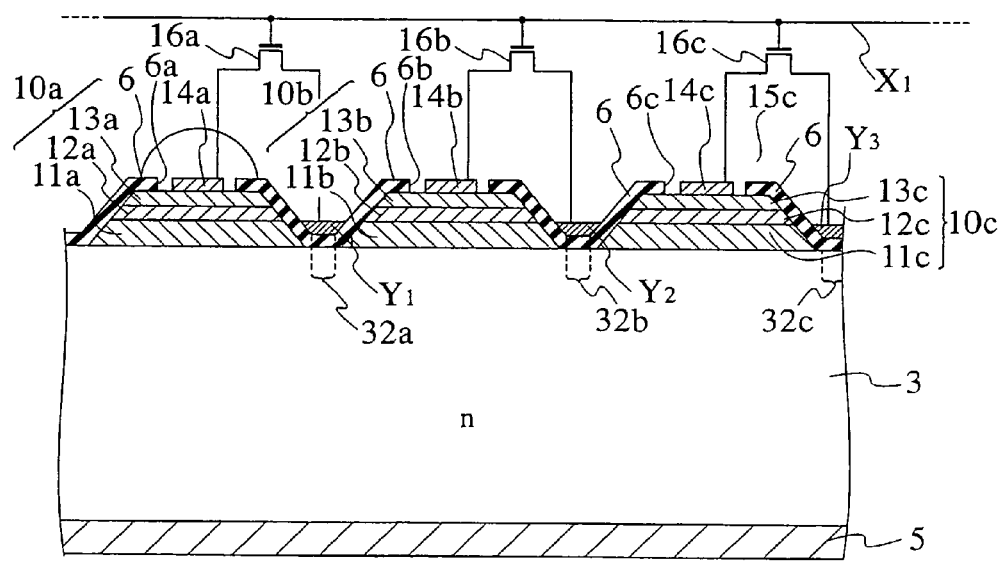
FIG. 18 is a sectional view for explaining a semiconductor light-emitting device and a light-emitting display according to a sixth embodiment of the present invention.

As shown in FIG. 18, the light-emitting display according to the sixth embodiment of the present invention includes a substrate 3, a plurality of (first to third) light-emitting-element-layers 10a, 10b and 10c made of semiconductor materials which are formed on the substrate 3 so as to be isolated from each other and which have wider band gaps than the substrate 3, and first to third phosphors 15a, 15b and 15c for converting the wavelengths of the lights from the first to third light-emitting-element-layers 10a, 10b and 10c into different wavelengths. FIG. 18 shows a semiconductor light-emitting device which includes the first to third light-emitting-element-layers 10a, 10b and 10c and the first to third phosphors 15a, 15b and 15c constituting one unit picture element (pixel). However, in addition to those shown in FIG. 18, there are first light-emitting-element-layers 10a, 10e, . . . , first phosphors 15a, 15e, . . . , second light-emitting-element-layers 10b, 10f, . . . , second phosphors 15b, 15f, . . . , third light-emitting-element-layers 10c, 10d, . . . , and the third phosphors 15c, 15d, . . . , similar to the first embodiment of the present invention. In the light-emitting display according to the sixth embodiment of the present invention, the second phosphors 15b, 15f, . . . and the third phosphors 15c, 15d, . . . of the first and second embodiments of the present invention are not used.

In the sixth embodiment of the present invention, light from the first light-emitting-element-layers 10a, 10e, . . . and the second light-emitting-element-layers 10b, 10f, . . . are mutually the same wavelength, and are one of blue light, red light, and green light. Wavelengths of light from the third light-emitting-element-layers 10c, 10d, . . . which are different from wavelengths of the first light-emitting-element-layers 10a, 10e, . . . and the second light-emitting-element-layers 10b, 10f, . . . , and are one of blue light, red light, and green light. For instance, the first light-emitting-element-layers 10a, 10e, . . . and the second light-emitting-element-layers 10b, 10f, . . . are blue LEDs respectively. On the other hand, the third light-emitting-element-layers 10c, 10d, . . . are green LEDs.

The first phosphors 15a, 15e, . . . convert wavelengths of blue light from the first light-emitting-element-layers 10a, 10e, . . . into red light as the first wavelengths. Blue light is emitted from The second light-emitting-element-layers 10b, 10f, . . . , and green light is emitted from the third light-emitting-element-layers 10c, 10d, . . . , and thus full-color can be displayed.

As described earlier, with the light-emitting display according to the sixth embodiment of the present invention, display speed can be enhanced, longevity can be increased, and environmental resistance and reliability can also be improved by converting the wavelengths of light from the first light-emitting-element-layers 10a, 10e, . . . into first wavelengths different from the foregoing wavelengths through the first phosphor 15a.

Further, provision of the first phosphors 15a, 15e, . . . eliminates the necessity of color filters and achieves an extremely small loss of light. In addition, manufacturing processes can be simplified, achieving cost reduction.

Figure 19:
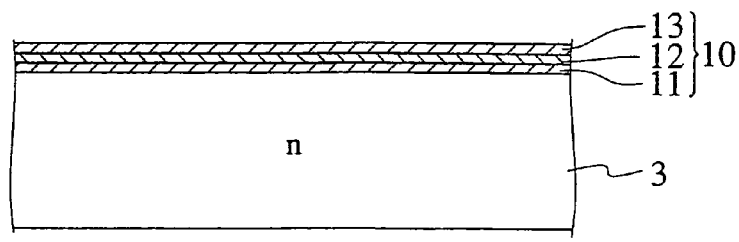
FIGS. 19 and 20 are sectional views for explaining a method for manufacturing the semiconductor light-emitting device and the light-emitting display according to the sixth embodiment of the present invention.
Figure 19:
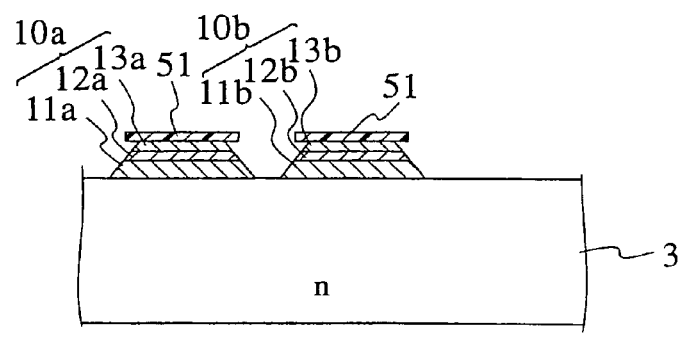
Figure 19:
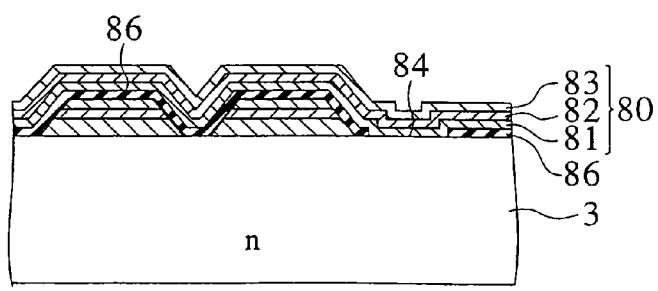
Figure 19:
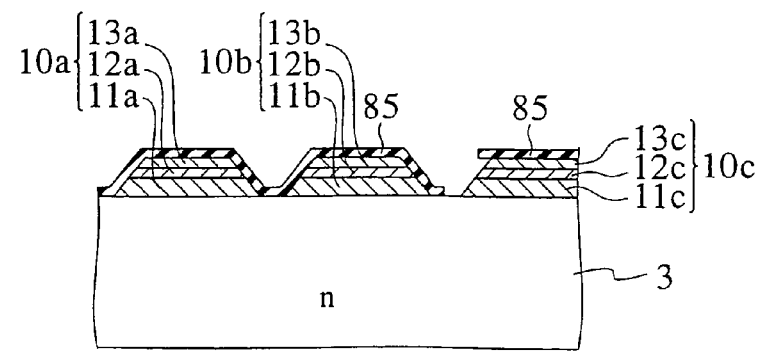
Figure 20:
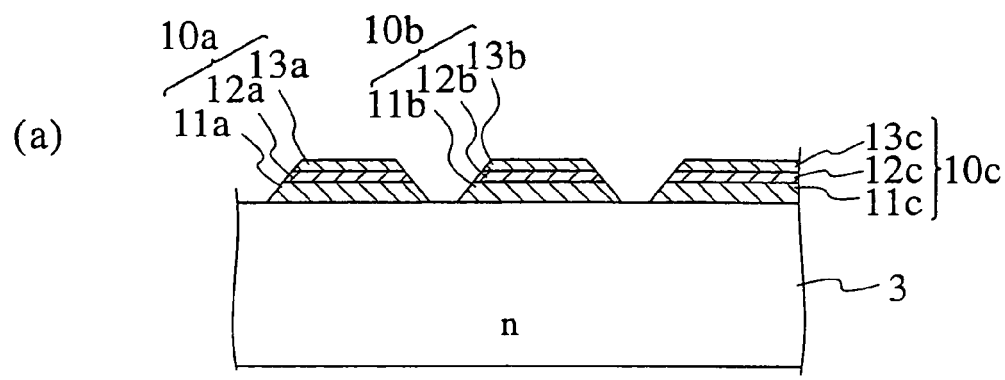
Figure 20:
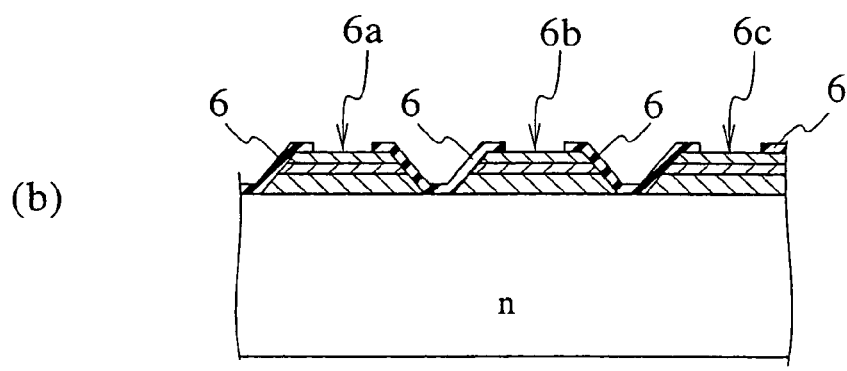
Figure 20:
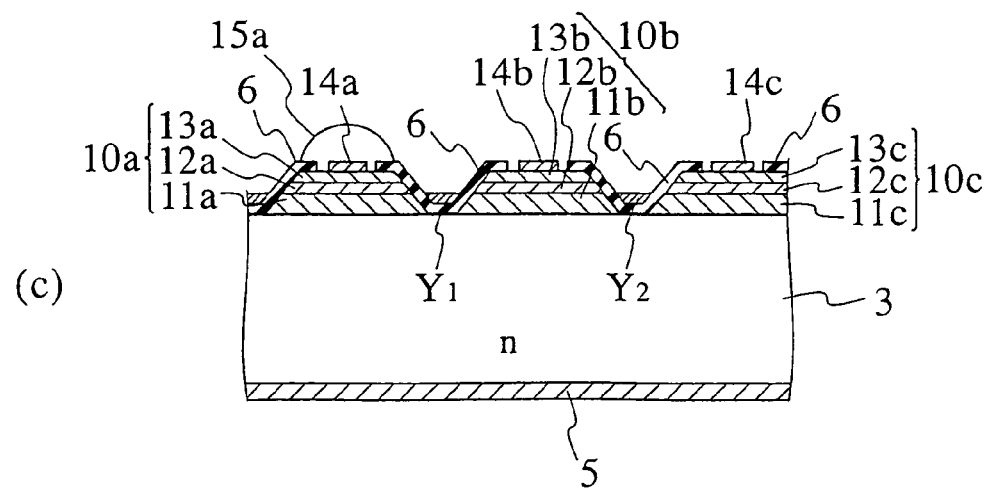

Next, a method for manufacturing a light-emitting display according to the sixth embodiment of the present invention will be described referring to FIGS. 19 and 20.

(a) As shown in FIG. 19(a), by MOCVD or the like, an n-type cladding layer 11, a non-doped active layer 12, and a p-type cladding layer 13 are sequentially superimposed on the substrate 3, thus forming a light-emitting layer 10. Resist 51 is then applied onto the p-type cladding layer 13 by spin coating, and this resist 51 is patterned by photolithography technology. By using the patterned resist 51 as an etching mask, the light-emitting layer 10 is etched until the substrate 3 is exposed, by wet etching or the like. In the wet etching, for example, a HCl/HNO$_3$ solution, a NaOH solution, a KOH solution, or the like is used as an etching solution. As a result, as shown in FIG. 9(a), part of the light-emitting layer 10 is selectively removed, and first light-emitting-element-layers 10a, 10e, . . . and second light-emitting-element-layers 10b, 10f, . . . are formed.

(b) Next, a silicon oxide film 86 is deposited by CVD to cover the entire surface of the substrate 3. By using resist (not shown) as an etching mask, the silicon oxide film 86 is patterned by lithography technology, thus a window 84 is formed as shown in FIG. 9(b). Then, by MOCVD or the like, an n-type cladding layer 81, a non-doped active layer 82, and a p-type cladding layer 83 are sequentially superimposed on the the silicon oxide film 86 and the exposed substrate 3 at the windows 84, thus forming a light-emitting layer 80. In the sixth embodiment of the present invention, the light-emitting layer 80 is a green LED. Next, a resist 85 is then applied onto the p-type cladding layer 13 by spin coating, and this resist 85 is patterned by photolithography technology. By using the patterned resist 85 as an etching mask, the light-emitting layer 80 is etched until the substrate 3 is exposed, by wet etching or the like. In the wet etching, for example, a HCl/HNO$_3$ solution, a NaOH solution, a KOH solution, or the like is used as an etching solution. As a result, as shown in FIG. 19(d), the third light-emitting-element-layer 10c, 10d, . . . are formed. Thereafter, as shown in FIG. 20(a), silicon oxide films 85 and 86 are removed by HF or the like.

(c) Next, a silicon oxide film 6 is deposited by CVD to cover the entire surface of the substrate 3. By using resist (not shown) as an etching mask, the silicon oxide film 6 is patterned by lithography technology. Thus, the contact holes 96a to 96c, . . . are formed in the driving IC area 3a, and the windows 6a, 6b, 6c, . . . are formed in the light-emitting device formation area 3c, as shown in FIG. 9(b).

(d) Next, in order to use the lift-off method, another new resist is applied to the silicon oxide film 6, and the windows 6a, 6b, 6c, . . . and patterned by lithography technology. A metal film of Au—Ni alloy or the like is then thinly deposited by vacuum deposition, sputtering, or the like to be optically transparent. Subsequently, the new resist is lifted off, thereby forming anode electrodes 14a, 14b, 14c, . . . which are in low-resistance ohmic contact with the p-type cladding layers 13a, 13b, 13c, . . . .

(e) Next, a thin refractory metal film is deposited on the surface of the wafer by sputtering or the like. Then, by using resist (not shown) as an etching mask formed by lithography technology, gate electrode lines $X_1, X_2, X_3, \ldots$ (FIG. 2) are formed on grooves 31a, 32b, . . . (FIG. 2) by RIE or the like. These gate electrode lines $X_1, X_2, X_3, \ldots$ are formed to be extended to the driving circuit section 4a, and electrically connected to the driving circuit section 4a (not shown). Next, first interlayer insulating films 17a to 17i, . . . (not shown) are deposited on the gate electrode lines $X_1, X_2, X_3, \ldots$ (FIG. 2) by CVD. Subsequently, a new thin refractory metal film is deposited on the entire upper surfaces of the first interlayer insulating films by sputtering or the like. Thereafter, an etching mask of resist is delineated by lithography technology. By RIE or the like in which this etching mask is used, source electrode lines $Y_1, Y_2, Y_3, \ldots$ are formed along grooves 32a, 32b, 32c, . . . as shown in FIG. 20(d). At this time, the source electrode lines $Y_1, Y_2,$ $Y_3, \ldots$ are formed to be extended to the data signal circuit 62, and electrically connected to the data signal circuit 62.

(f) Next, a second interlayer insulating film (not shown) is deposited on the source electrode lines $Y_1, Y_2, Y_3, \ldots$ by CVD. Thereafter, an etching mask of resist is delineated by lithography technology. By RIE or the like in which this etching mask is used, anode contact holes for partially exposing the anode electrodes 14a, 14b, 14c, . . . and source contact holes for partially exposing the source electrode lines $Y_1, Y_2, Y_3, \ldots$ are opened in part of the second interlayer insulating film. The subsequent step of forming TFTs is the same as that of the first embodiment of the present invention and therefore will not be further described. The gate electrodes of the TFTs 16a, 16b, 16c, . . . are connected to the gate electrode lines $X_1, X_2, X_3,$ respectively. Moreover, the source electrodes of the TFTs 16a, 16b, 16c, . . . are respectively connected to the source electrode lines $Y_1, Y_2, Y_3, \ldots$, and the drain electrodes thereof are respectively connected to the anode electrodes 14a, 14b, 14c, . . . . Furthermore, a third interlayer insulating film (not shown) is deposited on the gate electrodes of the TFTs by CVD. Thereafter, Al, Al—Ni alloy, or the like is deposited on the back surface (second main surface) of the substrate 3 by vacuum deposition, sputtering, or the like, thus forming the cathode electrode 5.

(g) Next, in order to use the lift-off method, new resist is applied onto the third interlayer insulating film and patterned by lithography technology. Thereafter, fluorescent material is deposited by vacuum deposition, sputtering, or the like. Subsequently, the resist is lifted off, thereby forming the first phosphor 15a, 15e, . . . on the first light-emitting-element-layer 10a as shown in FIG. 20(c). Finally, the substrate 3 is mounted on a package, thus completing the light-emitting display according to the sixth embodiment of the present invention shown in FIG. 18.

The method of manufacturing the light-emitting display according to the sixth embodiment of the present invention is an example. As a matter of course, the light-emitting display body can be achieved by various manufacturing methods other than this.

OTHER EMBODIMENTS

Although the invention has been described above by reference to the first to sixth embodiments of the invention, the invention is not limited to the embodiments described above. Modifications and variations of the embodiments described above will occur to those skilled in the art, in the light of the above teachings.

In the aforementioned first to sixth embodiments of the present invention, a AlN-based or GaN-based wide band gap semiconductor is used for light-emitting-element-layers. However, light-emitting-element-layers are not particularly limited as long as they are light-emitting-element-layers of Eg=2.45 eV or greater, for example, light-emitting-element-layers made of zinc sulfide (ZnS) (band gap Eg=3.6 eV), zinc selenide (ZnSe) (Eg=2.6 eV), and the like that are II-VI group semiconductors may be used.

Further, in the first to sixth embodiments of the present invention, a silicon single crystal substrate is used as the substrate 3. However, for example, a sapphire ($Al_2O_3$) substrate can be used in the case where light-emitting-element-layers based on GaN of the hexagonal system are provided, and a gallium arsenide (GaAs) substrate or the like can be used in the case where light-emitting-element-layers based on ZnS or ZnSe of the cubic system are provided. Thus, the material for the substrate is appropriately selected.

Moreover, in the first to fifth embodiments of the present invention, the phosphors 15a, 15b, 15c, . . . are divided into the first phosphors 15a, 15e, . . . , the second phosphors 15b, 15f, . . . , and the third phosphors 15c, 15d, . . . . However, the phosphors 15a, 15b, 15c, . . . are not particularly limited as long as they achieve an appropriate light-emitting display and each of the phosphors 15a, 15b, 15c, . . . is any one of the first to third phosphors.

Furthermore, in the first to fifth embodiments of the present invention, the phosphors 15a, 15b, 15c, . . . are appropriately used depending on the wavelengths of light emitted from the first to third light-emitting-element-layers 10a, 10b, 10c, . . . . Thus, the wavelengths of light are not particularly limited. In other words, as long as the light-emitting-element-layers 10a, 10b, 10c, . . . emit light having wavelengths capable of being converted into wavelengths suitable for light-emitting display by the phosphors 15a, 15b, 15c, . . . , the compositions and structures thereof are not particularly limited.

Further, in the first to third and fifth embodiments of the present invention, the DBRs 9a, 9b, 9c, . . . which serve as reflective films and buffer layers are interposed between the substrate 3 and the first to third light-emitting-element-layers 10a, 10b, 10c, . . . , respectively. However, instead of the DBRs 9a, 9b, 9c, . . . , buffer layers, such as reflective metal films 18a, 18b, 18c, . . . shown in FIG. 11, may be provided. Further, instead of the DBRs 9a, 9b, 9c, . . . , buffer layers without the function of a reflective film may be provided. Moreover, buffer layers are not necessarily provided. In the fourth embodiment of the present invention, instead of the reflective metal films 18a, 18b, 18c, . . . , DBRs or the like may be used. Furthermore, in the sixth embodiment of the present invention, buffer layers, such as DBRs, may be placed between the substrate 3 and the first to third light-emitting-element-layers 10a, 10b, 10c, . . . , respectively.

In the first to third embodiments of the present invention, the DBRs 9a, 9b, 9c, . . . and the first to third light-emitting-element-layers 10a, 10b, 10c, . . . are isolated from each other and delimited by the grooves 31a, 31b, 31c, . . . and 32a, 32b, 32c, . . . . However, the DBRs 9a, 9b, 9c, . . . and the first to third light-emitting-element-layers 10a, 10b, 10c, . . . may be delimited by, for example, high-resistivity areas formed by applying protons ($H^+$) to the DBRs 9a, 9b, 9c, . . . and the first to third light-emitting-element-layers 10a, 10b, 10c, . . . .

Each of the light-emitting display bodies according to the first to third, fifth, and sixth embodiments of the present invention includes the TFTs 16a, 16b, 16c, However, instead of the TFTs 16a, 16b, 16c, . . . , thin film diodes (TFDs) or metal-insulator-metal (MIM) diodes, which are practically used as two-terminal elements, may be used as switching elements.

In addition, in the sixth embodiment of the present invention, the second phosphors 15b, 15f, . . . may be used instead of the first phosphors 15a, 15e, . . . . Further, for example, where the first light-emitting-element-layers 10a, 10e, . . . and the second light-emitting-element-layers 10b, 10f, . . . emit ultraviolet light instead of blue light, as the first and second wavelengths, the first phosphors 15a, 15e, . . . are provided to perform wavelength conversion from ultraviolet light having the first wavelength of the first wavelength into blue light and the second phosphors 15b, 15f, . . . are provide to perform wavelength conversion from ultraviolet light having the second wavelength as the second wavelength into blue light. Red excitation light is thus emitted as the third wavelength from the third light-emitting-element-layers 10c, 10d, . . . . Accordingly, full color display can be performed.

The present invention may be embodied in other specific forms without departing from the spirit or essential characteristics thereof. The scope of the invention is defined with reference to the following claims.

According to the present invention, a semiconductor light-emitting device, a light-emitting display, a method for manufacturing a semiconductor light-emitting device and a method for manufacturing a light-emitting display are provided, in which display speed can be high, longevity can be ensured, environmental resistance can be superior, loss of light can be minimized and energy can be low, manufacturing processes can be simplified, and cost reduction can be achieved.

What is claimed is:

1. A semiconductor light-emitting device comprising:
   a silicon single crystal substrate;
   a plurality of light-emitting-element-layers of a nitride-based compound semiconductor formed on the silicon single crystal substrate to be isolated from each other by an isolation area and having a wider band gap than the silicon single crystal substrate respectively;
   a phosphor converting a wavelength of light from the light-emitting-element-layer into another wavelength;
   first electrodes provided on top surfaces of the light-emitting-element-layers respectively within the phosphor and electrically connected to the light-emitting-element-layers respectively; and
   a second electrode provided on a lower surface of the silicon single crystal substrate and electrically connected to the light-emitting-element-layers.

2. The semiconductor light-emitting device of claim 1, further comprising a Bragg reflective film between the silicon single crystal substrate and the light-emitting-element-layer.

3. The semiconductor light-emitting device of claim 1, further comprising a reflective metal film between the substrate and the light-emitting-element-layer.

4. The semiconductor light-emitting device of claim 1, wherein the isolation area is a groove formed between the light-emitting-element-layers.

5. The semiconductor light-emitting device of claim 1, wherein the light-emitting-element-layers comprise first to third light-emitting-element-layers emitting excitation light of the same wavelengths.

6. The semiconductor light-emitting device of claim 5, wherein the phosphor comprises a first phosphor provided on the first light-emitting-element-layer to convert the wavelength of the excitation light from the first light-emitting-element-layer into a first wavelength.

7. The semiconductor light-emitting device of claim 6, wherein the phosphor further comprises a second phosphor provided on the second light-emitting-element-layer to convert the wavelength of the excitation light from the second light-emitting-element-layer into a second wavelength differing from the first wavelength.

8. The semiconductor light-emitting device of claim 7, wherein the phosphor further comprises a third phosphor provided on the third light-emitting-element-layer to convert wavelength of the excitation light from the third light-emitting-element-layer into a third wavelength differing from the first and second wavelengths.

9. A light-emitting display implemented by a plurality of pixels on a silicon single crystal substrate, each of the pixels comprising:

a plurality of light-emitting-element-layers of a nitride-based compound semiconductor formed on the silicon single crystal substrate so as to be isolated from each other by an isolation area and having a wider band gap than the silicon single crystal substrate respectively;

a phosphor converting a wavelength of light from the light-emitting-element-layer into another wavelength;

first electrodes provided on top surfaces of the light-emitting-element-layers respectively within the phosphor and electrically connected to the light-emitting-element-layers respectively; and a second electrode provided on a lower surface of the silicon single crystal substrate and electrically connected to the light-emitting-element-layers.

10. The light-emitting display of claim 9, further comprising a Bragg refractive film disposed between the silicon single crystal substrate and the light-emitting-element-layer.

11. The light-emitting display of claim 9, further comprising a semiconductor device in the silicon single crystal substrate for controlling emission from the light-emitting-element-layer.

12. The light-emitting display of claim 9, wherein the plurality of light-emitting-element-layers comprises first to the third light-emitting-element-layers emitting excitation light of the same wavelengths.

13. The light-emitting display of claim 12, wherein the phosphor comprises a first phosphor provided on the first light-emitting-element-layer to convert the wavelength of the excitation light from the first light-emitting-element-layer into a first wavelength.

14. The light-emitting display of claim 13, wherein the phosphor further comprises a second phosphor provided on the second light-emitting-element-layer to convert the wavelength of the excitation light from the second light-emitting-element-layer into a second wavelength differing from the first wavelength.

15. The light-emitting display of claim 14, wherein the phosphor further comprises a third phosphor provided on the third light-emitting-element-layer to convert the wavelength of the excitation light from the third light-emitting-element-layer into a third wavelength differing from the first and second wavelengths.

16. A semiconductor light-emitting device comprising:

a substrate;

a plurality of light-emitting-element-layers of semiconductor material formed on the substrate to be isolated from each other and having a wider band gap than the substrate respectively;

a phosphor converting a wavelength of light from the light-emitting-element-layer into other wavelength;

first electrodes provided on top surfaces of the light-emitting-element-layers respectively within the phosphor and electrically connected to the light-emitting-element-layers respectively; and a second electrode provided on a lower surface of the silicon single crystal substrate and electrically connected to the light-emitting-element-layers.

* * * * *